United States Patent
Hsu

(10) Patent No.: US 11,355,435 B2
(45) Date of Patent: Jun. 7, 2022

(54) SEMICONDUCTOR DEVICE WITH AIR GAPS

(71) Applicant: NANYA TECHNOLOGY CORPORATION, New Taipei (TW)

(72) Inventor: Chia-Hsiang Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 82 days.

(21) Appl. No.: 16/857,931

(22) Filed: Apr. 24, 2020

(65) Prior Publication Data

US 2021/0335711 A1    Oct. 28, 2021

(51) Int. Cl.
*H01L 23/532* (2006.01)
*H01L 21/768* (2006.01)
*H01L 23/48* (2006.01)

(52) U.S. Cl.
CPC ...... *H01L 23/5329* (2013.01); *H01L 21/7682* (2013.01); *H01L 23/481* (2013.01); *H01L 23/53238* (2013.01)

(58) Field of Classification Search
CPC ............. H01L 23/5329; H01L 21/7682; H01L 23/53238; H01L 23/481
See application file for complete search history.

(56) References Cited

U.S. PATENT DOCUMENTS

| | | | |
|---|---|---|---|
| 7,291,923 B1 | 11/2007 | Lesea et al. | |
| 2017/0084485 A1* | 3/2017 | Lin | H01L 21/76831 |
| 2018/0033684 A1* | 2/2018 | Singh | H01L 21/76885 |
| 2018/0315704 A1* | 11/2018 | Chen | H01L 21/76805 |
| 2019/0267279 A1 | 8/2019 | Cheng et al. | |
| 2019/0371665 A1* | 12/2019 | Schelling | H01L 23/481 |
| 2020/0006261 A1 | 1/2020 | Lin | |

OTHER PUBLICATIONS

Office Action dated Sep. 10, 2021 in TW Application No. 110109761, 6 pages.

* cited by examiner

*Primary Examiner* — Patricia D Valenzuela

(74) *Attorney, Agent, or Firm* — Muncy, Geissler, Olds & Lowe, P.C.

(57) ABSTRACT

The present application discloses a semiconductor device with air gaps for reducing capacitive coupling between conductive features. The semiconductor device includes a first semiconductor structure including a substrate, a first conductive line positioned above the substrate and including two sides, a first protruding portion positioned on one of the two sides of the first conductive line, a second conductive line positioned adjacent to the first conductive line and including two sides, a second protruding portion positioned on one of the two sides of the second conductive line and face onto the first protruding portion, and an air gap positioned between the first protruding portion and the second protruding portion. A distance between the first protruding portion and the second protruding portion is less than a distance between the first conductive line and the second conductive line.

15 Claims, 40 Drawing Sheets

SEMICONDUCTOR DEVICE WITH AIR GAPS

TECHNICAL FIELD

The present disclosure relates to a semiconductor device and a method for fabricating the semiconductor device, and more particularly, to a semiconductor device with air gaps for reducing capacitive coupling between conductive features.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first conductive line positioned above the substrate and including two sides, a first protruding portion positioned on one of the two sides of the first conductive line, a second conductive line positioned adjacent to the first conductive line and including two sides, a second protruding portion positioned on one of the two sides of the second conductive line and face onto the first protruding portion, and an air gap positioned between the first protruding portion and the second protruding portion. A distance between the first protruding portion and the second protruding portion is less than a distance between the first conductive line and the second conductive line.

In some embodiments, the semiconductor device includes a coverage layer positioned on the first conductive line and the second conductive line and sealed the air gap.

In some embodiments, the first protruding portion is positioned adjacent to one end of the first conductive line and the second protruding portion is positioned adjacent to one end of the second conductive line.

In some embodiments, the semiconductor device includes an insulating layer and a first liner layer positioned on one side of the first protruding portion, one side of the second protruding portion, and a top surface of the insulating layer, wherein the one side of the first protruding portion and the one side of the second protruding portion are faced to each other.

In some embodiments, the semiconductor device includes an insulating layer and a plurality of second liner layers. The first conductive line and the second conductive line are positioned on the insulating layer and the plurality of second liner layers are positioned on sides of the first protruding portion, sides of the second protruding portion, and a top surface of the insulating layer.

In some embodiments, the semiconductor device includes a plurality of third liner layers positioned on sides of the first protruding portion and sides of the second protruding portion.

In some embodiments, the semiconductor device includes a fourth liner layer positioned below the coverage layer and first protruding portion and the second protruding portion.

In some embodiments, the semiconductor device includes a sealing layer positioned on the one end of the first conductive line and the one end of the second conductive line, wherein the first conductive line, the second conductive line, and the sealing layer are at a same vertical level.

In some embodiments, the semiconductor device includes a plurality of protection layers positioned between the first conductive line and the coverage layer and between the second conductive line and the coverage layer.

In some embodiments, the plurality of protection layers are formed of tantalum, tantalum nitride, tungsten carbonitride, cobalt-tungsten-phosphide alloy, cobalt phosphide alloy, nickel-tungsten-phosphide alloy, nickel boron alloy, cobalt-tungsten-boron alloy, nickel-rhenium-phosphide alloy, cobalt-rhenium-phosphide alloy, or nickel.

In some embodiments, the air gap is extended in parallel to major axes of the first conductive line and the second conductive line.

In some embodiments, the first liner layer is porous.

In some embodiments, a porosity of the first liner layer is between about 45% and about 75%.

In some embodiments, the semiconductor device includes a plurality of barrier layers positioned on sides of the first protruding portion and sides of the second protruding portion. The plurality of barrier layers are formed of titanium, titanium nitride, titanium silicon nitride, tantalum, tantalum nitride, or tantalum silicon nitride.

In some embodiments, a thickness of the plurality of barrier layers is between about 11 angstroms and about 13 angstroms.

Due to the design of the semiconductor device of the present disclosure, the parasitic capacitance of adjacent pairs of the conductive features may be alleviated by the plurality of first air gaps. In addition, no extra mask or patterning process is needed for formation of the plurality of first air gaps. Therefore, the cost of fabrication of the semiconductor device may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
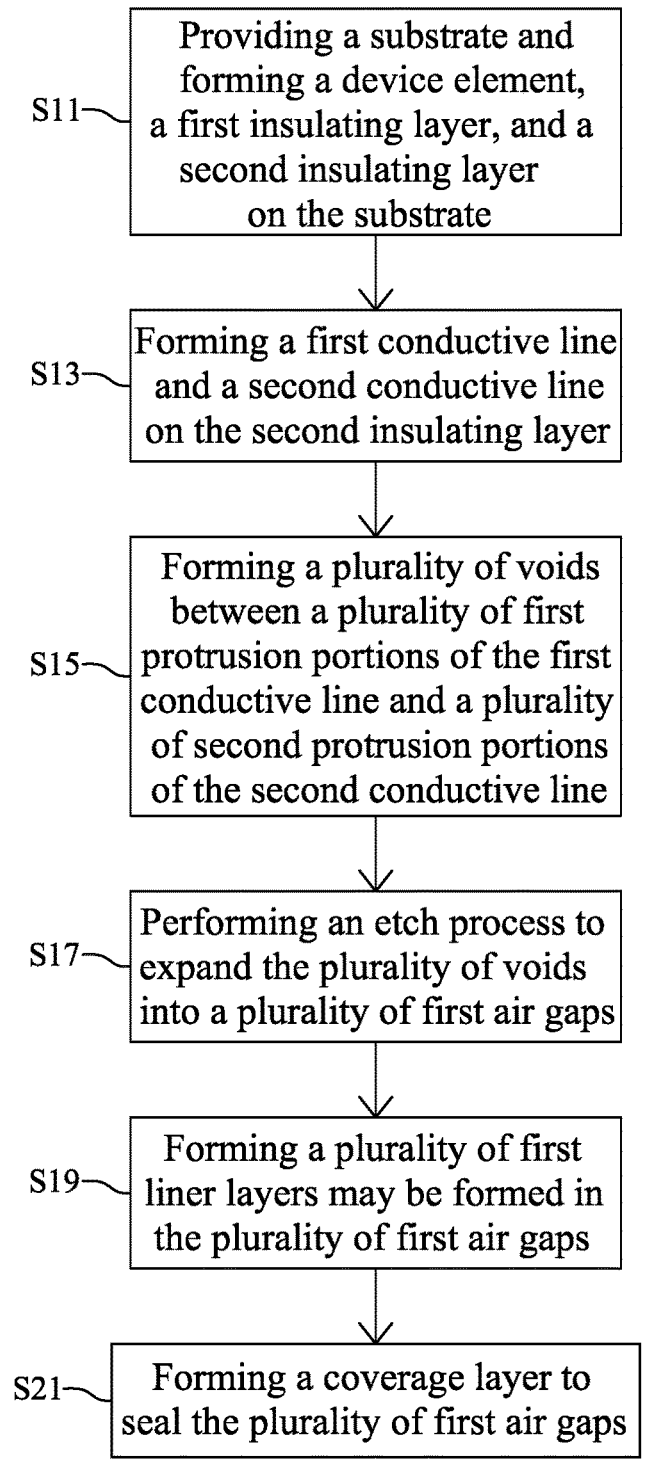
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

It should be noted that the term "about" modifying the quantity of an ingredient, component, or reactant of the present disclosure refers to variation in the numerical quantity that can occur, for example, through typical measuring and liquid-handling procedures used for making concentrates or solutions. Furthermore, variation can occur from inadvertent error in measuring procedures, differences in the manufacture, source, or purity of the ingredients employed to make the compositions or carry out the methods, or the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, a direction Z may be a direction parallel to the normal line of the main plane of the semiconductor device. Above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

It should be noted that the functions or steps noted herein may occur in an order different from the order noted in the figures. For example, two figures shown in succession may in fact be executed substantially concurrently or may sometimes be executed in a reversed order, depending upon the functionalities or steps involved.

Figure 2:
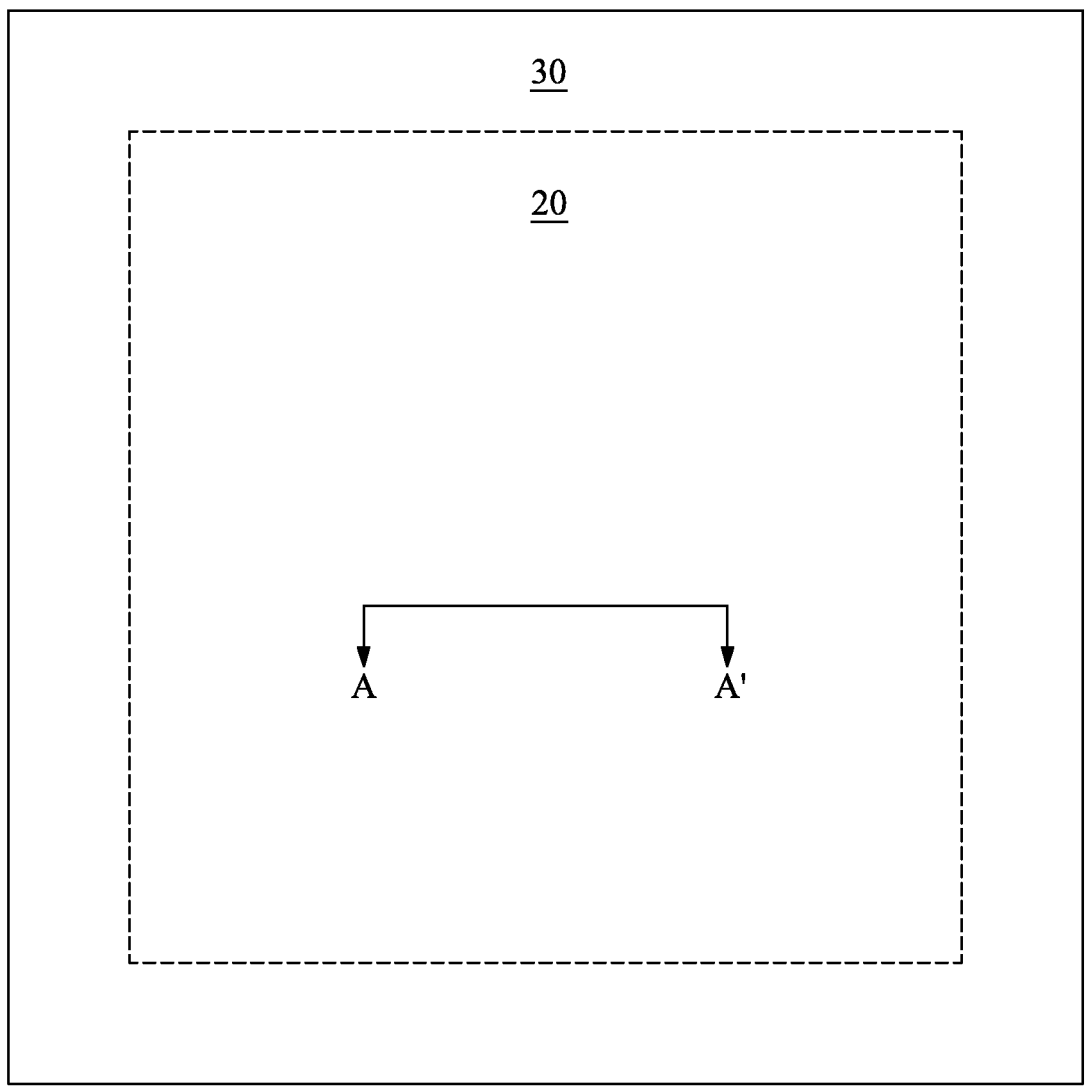
FIG. 2 illustrates, in a schematic top view diagram, an intermediate semiconductor device in accordance with one embodiment of the present disclosure.
Figure 3:
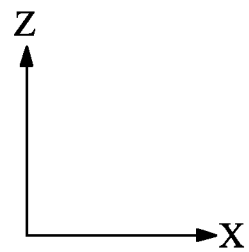
FIG. 3 is a schematic cross-sectional view diagram taken along a line A-A' in FIG. 2.
Figure 3:
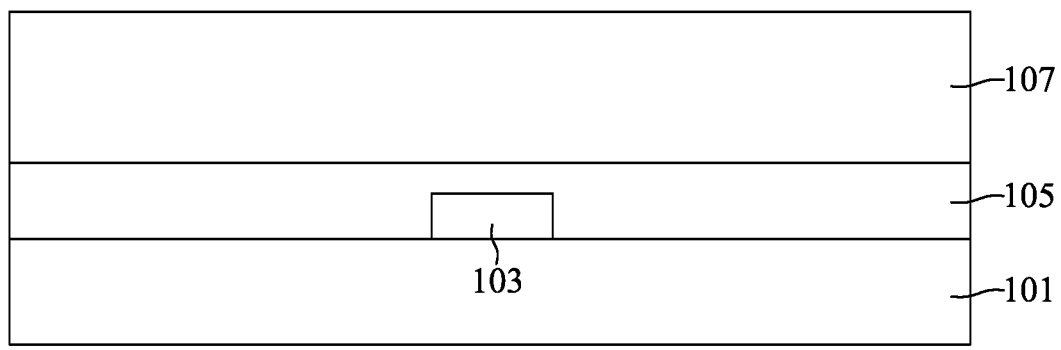

FIG. 1 illustrates, in a flowchart diagram form, a method 10 for fabricating a semiconductor device in accordance with one embodiment of the present disclosure. FIG. 2 illustrates, in a schematic top view diagram, an intermediate semiconductor device in accordance with one embodiment of the present disclosure. FIG. 3 is a schematic cross-sectional view diagram taken along a line A-A' in FIG. 2. Some elements of the semiconductor device of the present disclosure are not shown in FIG. 2 for clarity.

With reference to FIGS. 1 to 3, at step S11, in the embodiment depicted, a substrate 101 may be provided and a device element 103, a first insulating layer 105, and a second insulating layer 107 may be formed on the substrate 101. The substrate 101 may include an array area 20 and a peripheral area 30. The array area 20 may be surrounded by the peripheral area 30. The substrate 101 may be formed of, for example, silicon, silicon carbide, germanium silicon germanium, gallium arsenic, indium arsenide, indium, or other semiconductor materials including group III, group IV, and group V elements. In some embodiments, the substrate 101 may include a silicon-on-insulator structure. For example, the substrate 101 may include a buried oxide layer formed using a process such as separation by implanted oxygen.

It should be noted that the array area 20 may include a portion of the substrate 101 and a space above the portion of the substrate 101. Describing an element as being disposed on the array area 20 means that the element is disposed on a top surface of the portion of the substrate 101. Describing an element as being disposed above the array area 20 means that the element is disposed above the top surface of the portion of the substrate 101. In some embodiments, describing an element as being disposed in the array area 20 means that the element is disposed in the portion of the substrate 101; however, a top surface of the element may be even with the top surface of the portion of the substrate 101. In some embodiments, describing an element as being disposed in the array area 20 means that some portions of the element are disposed in the substrate 101 and other portions of the element are disposed on or above the substrate 101.

Accordingly, the peripheral area 30 may include another portion of the substrate 101 and a space above another portion of the substrate 101.

With reference to FIGS. 2 and 3, the device element 103 may be formed on the substrate 101. The device element 103 may be, for example, bipolar junction transistor, metal-oxide-semiconductor field-effect transistor, diode, flash memory, dynamic random-access memory, static random-access memory, electrically erasable programmable read-only memory, image sensor, micro-electro-mechanical system, active device, or passive device. The first device element may include a plurality of doped regions formed in the substrate 101. The plurality of doped regions may be doped with doped with a dopant such as phosphorus, arsenic, antimony, or boron. For convenience of description, only one device element 103 is described. It should be understood that, in most situation, more device elements 103 may be present in a semiconductor device.

An isolation layer (Not shown in FIG. 3) may formed in the substrate 101 and insulate the plurality of doped regions of the device element 103 from neighboring doped regions. The isolation layer may be formed of, for example, an insulating material such as silicon oxide, silicon nitride, silicon oxynitride, silicon nitride oxide, fluoride-doped silicate, or the like. It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIGS. 2 and 3, in the embodiment depicted, the first insulating layer 105 may be formed on the substrate 101 and cover the device element 103. The first insulating layer 105 may be formed of, for example, silicon nitride, silicon oxide, silicon oxynitride, undoped silica glass, borosilica glass, phosphosilica glass, borophosphosilica glass, or a combination thereof, but is not limited thereto. The first insulating layer 105 may be referred to as an interlayer dielectric.

With reference to FIGS. 2 and 3, in the embodiment depicted, the second insulating layer 107 may include a plurality of sub-layers. The plurality of sub-layers may be formed on the first insulating layer 105. Each of the plurality of sub-layers may have thicknesses between about 0.5 micrometers and about 3.0 micrometers. The plurality of sub-layers may be formed of, for example, silicon oxide, borophosphosilicate glass, undoped silicate glass, fluorinated silicate glass, low-k dielectric materials, the like, or a combination thereof. The plurality of sub-layers may be formed of different materials, but are not limited thereto. The low-k dielectric materials may have a dielectric constant less than 3.0 or even less than 2.5. In some embodiments, the low-k dielectric materials may have a dielectric constant less than 2.0. The second insulating layer 107 may be referred to as an interconnection layer.

Figure 4:
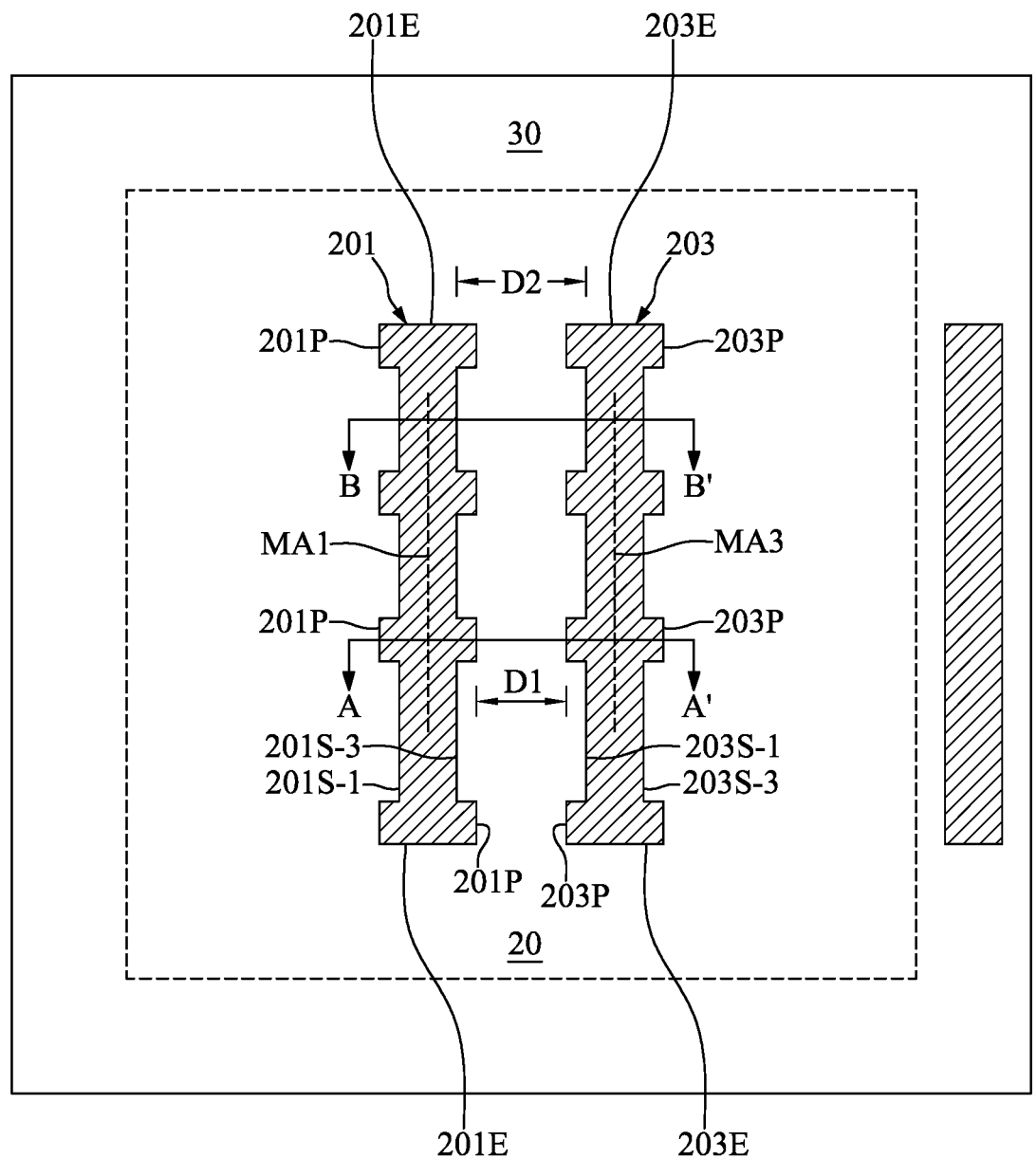
FIG. 4 illustrates, in a schematic top view diagram, an intermediate semiconductor device in accordance with one embodiment of the present disclosure.
Figure 5:
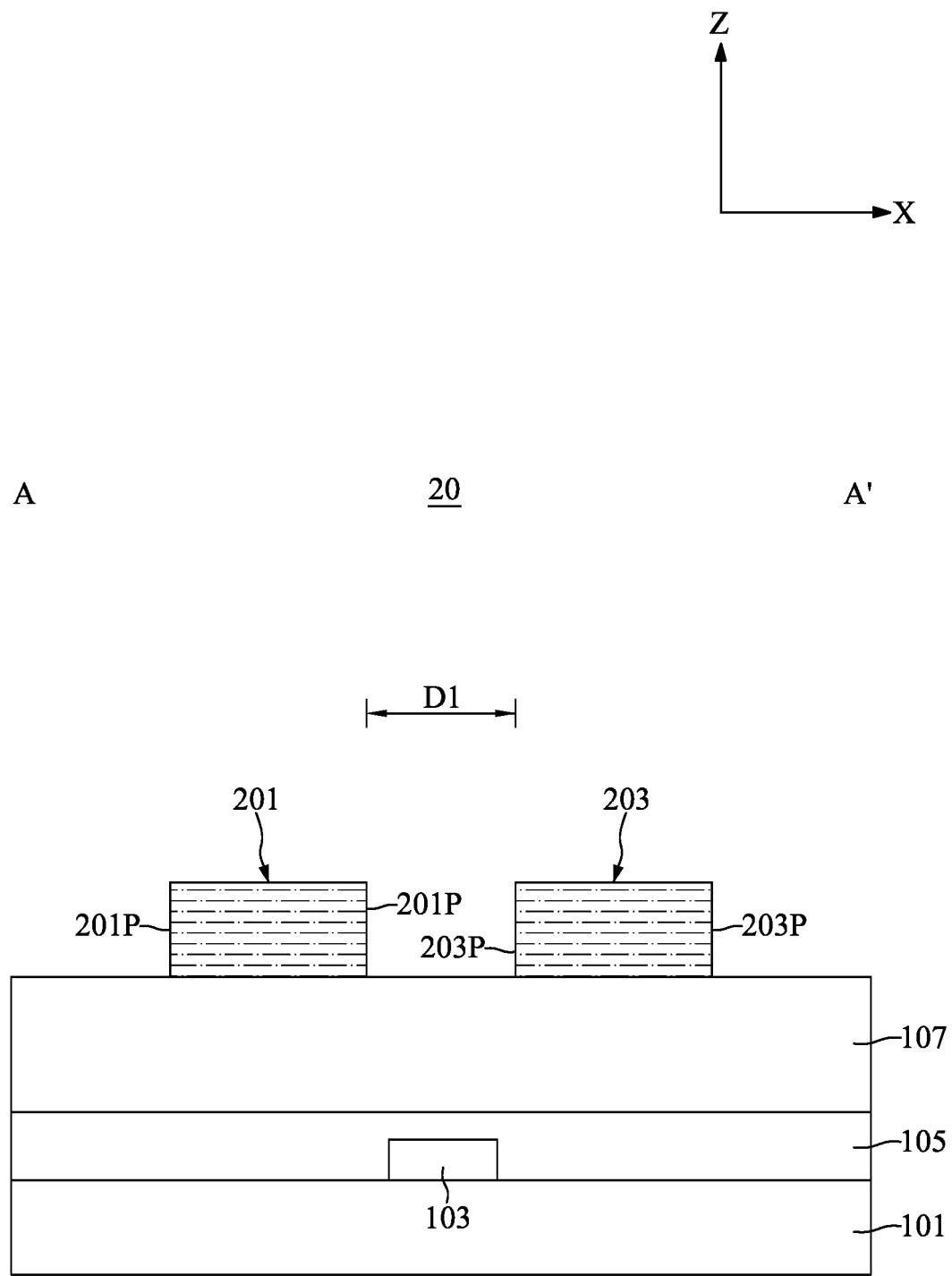
FIG. 5 is a schematic cross-sectional view diagram taken along a line A-A' in FIG. 4.
Figure 6:
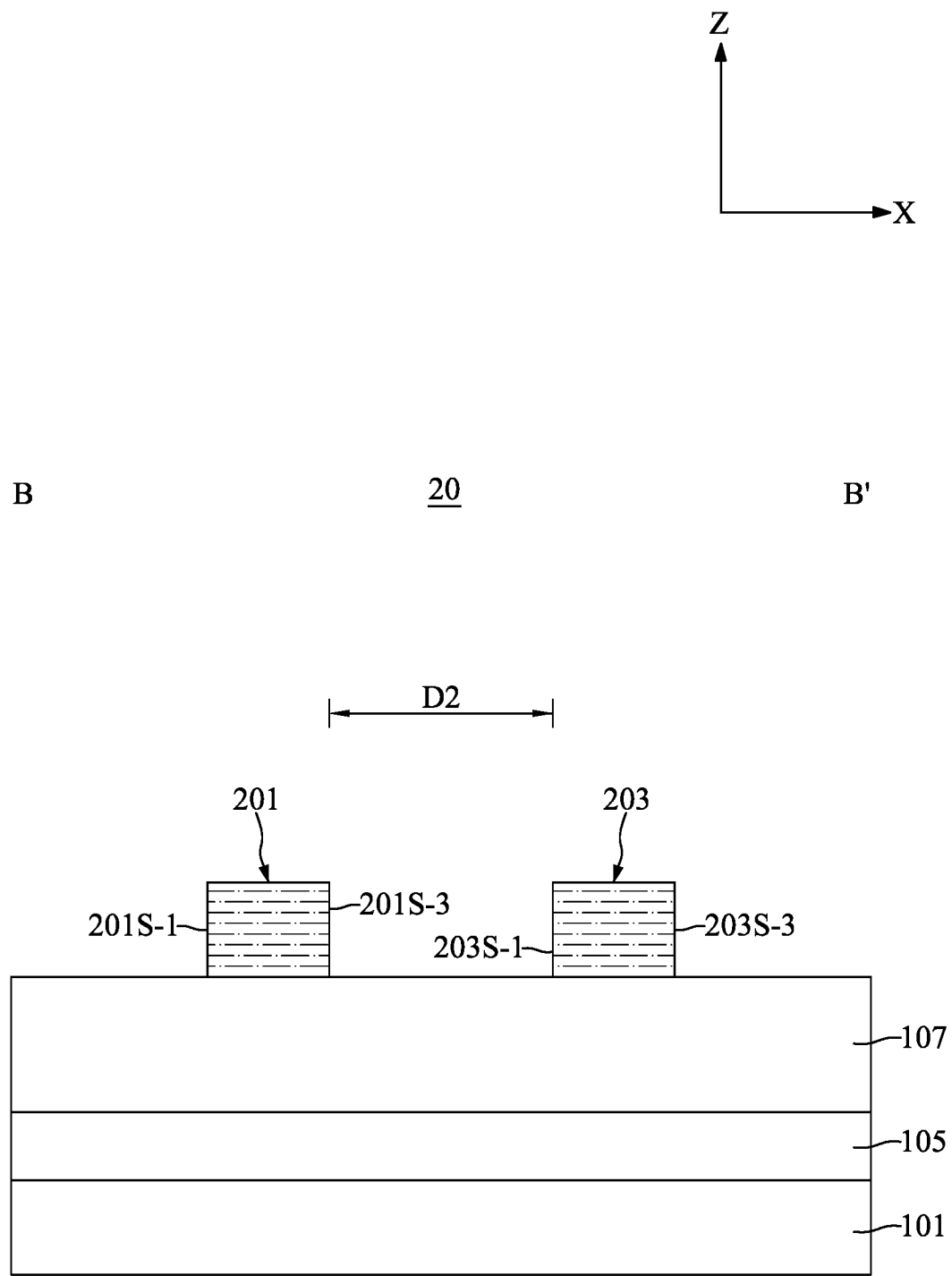
FIG. 6 is a schematic cross-sectional view diagram taken along a line B-B' in FIG. 4.

FIG. 4 illustrates, in a schematic top view diagram, an intermediate semiconductor device in accordance with one embodiment of the present disclosure. FIG. 5 is a schematic cross-sectional view diagram taken along a line A-A' in FIG. 4. FIG. 6 is a schematic cross-sectional view diagram taken along a line B-B' in FIG. 4. Some elements of the semiconductor device of the present disclosure are not shown in FIG. 4 for clarity.

With reference to FIGS. 1 and 4 to 6, at step S13, in the embodiment depicted, a plurality of conductive features may be formed above the substrate 101; specifically, the plurality of conductive features may be formed in and on the first insulating layer 105 and the second insulating layer 107. The plurality of conductive features may include, for example, conductive lines, conductive vias, and conductive contacts. The conductive via may connect adjacent conductive lines along the direction Z. The conductive vias may improve heat dissipation in the semiconductor device and provide structural support in the first insulating layer 105 and the second insulating layer 107. The device element 103 may be electrically coupled to the plurality of conductive features. The plurality of conductive features may be formed of, for example, copper, aluminum, titanium, the like, or a combination thereof. The conductive lines, the conductive vias, and the conductive contacts may be formed of different materials, but are not limited thereto.

In the embodiment depicted, the array area 20 may have an element density greater than that of the peripheral area 30. The element density may be a value defined by the elements (e.g., conductive lines) formed in the array area 20 or the peripheral area 30 divided by surface areas of the array area 20 or peripheral area 10 from a top-view perspective. From a cross-sectional perspective, a greater density may mean a smaller horizontal distance between adjacent elements. In other words, the array area 20 may be regarded as a dense area and the peripheral area 30 may be regarded as a loose area. More conductive lines are shown in figures to emphasize that the array area 20 is a dense area compared to the peripheral area 30.

For convenience of description and clarity, only a first conductive line 201 and a second conductive line 203 are labeled in figures and focused for description.

The first conductive line 201 may be formed on the second insulating layer 107 and extended along a first direction Y. The first conductive line 201 may include two sides 201S-1, 201S-3 and a plurality of first protruding portions 201P. In some embodiments, the plurality of first protruding portions 201P may be at the two sides 201S-1, 201S-3 of the first conductive line 201. The plurality of first protruding portions 201P at the side 201S-1 may be opposite to the plurality of first protruding portions 201P at the side 201S-3. In other words, from a top-view perspective, the corresponding first protruding portions 201P on both sides 201S1-1, 201S-3 may be located along a line parallel to a second direction X. From a top-view perspective, some of the plurality of first protruding portions 201P may be located at ends 201E of the first conductive line 201 and some other of the plurality of first protruding portions 201P may be located at middle of the first conductive line 201. In some embodiments, the plurality of first protruding portions 201P at the side 201S-1 may be offset from the plurality of first protruding portions 201P at the side 201S-3. In some embodiments, the plurality of first protruding portions 201P may only at the side 201S-3 which is faced onto the second conductive line 203 as will be illustrated later.

In some embodiments, the second conductive line 203 may be formed on the second insulating layer 107. The second conductive line 203 may be extended along the first direction Y and adjacent to the first conductive line 201. In some embodiments, only a portion of the second conductive line 203 may be parallel to and adjacent to the first conductive line 201. In some embodiments, the second conductive line 203 may only parallel to and adjacent to a portion of the first conductive line 201. The second conductive line 203 may include two sides 203S-1, 203S-3 and a plurality of second protruding portions 203P. In some embodiments, the plurality of second protruding portions 203P may be at the two sides 203S-1, 203S-3 of the second conductive line 203. The plurality of second protruding portions 203P at the side 203S-1 may respectively correspondingly face onto the plurality of first protruding portions 201P at the side 201S-3. The plurality of second protruding portions 203P at the side 203S-3 may be opposite to or offset from the plurality of second protruding portions 203P at the side 203S-1.

The spaces between the plurality of first protruding portions 201P at the side 201S-3 and the plurality of second protruding portions 203P at the side 203S-1 may be narrower than the spaces between the side 201S-3 of the first conductive line 201 and the side 203S-1 of the second conductive line 203. In other words, from a top-view perspective, the distances D1 between the plurality of first protruding portions 201P at the side 201S-3 and the plurality of second protruding portions 203P at the side 203S-1 may be less than the distance D2 between the side 201S-3 of the first conductive line 201 and the side 203S-1 of the second conductive line 203.

In some embodiments, the plurality of second protruding portions 203P at the side 203S-1 may be offset from the plurality of first protruding portions 201P at the side 201S-3. The spaces between the plurality of first protruding portions 201P at the side 201S-3 and the side 203S-1 of the second conductive line 203 and the spaces between the plurality of second protruding portions 203P at the side 203S-1 and the side 201S-3 of the first conductive line 201 may be narrower than the spaces between the side 201S-3 of the first conductive line 201 and the side 203S-1 of the second conductive line 203.

It should be noted that the direction of the first conductive line 201 and the second conductive line 203 are for illustration purpose only. For example, the direction of the first conductive line 201 and the second conductive line 203 may extend along the second direction X. For another example, the direction of the first conductive line 201 and the second conductive line 203 may extend a direction slanted with respective to the first direction Y and the second direction X. Yet another example, from a top-view perspective, shapes of the first conductive line 201 and the second conductive line 203 may be L-shaped. That is, the first conductive line 201 and the second conductive line 203 may concurrently extend along two directions such as the first direction Y and the second direction X. Yet another example, from a top-view perspective, shapes of the first conductive line 201 and the second conductive line 203 may be U-shaped, T-shaped, lighting-shaped, or other applicable shapes.

Figure 7:
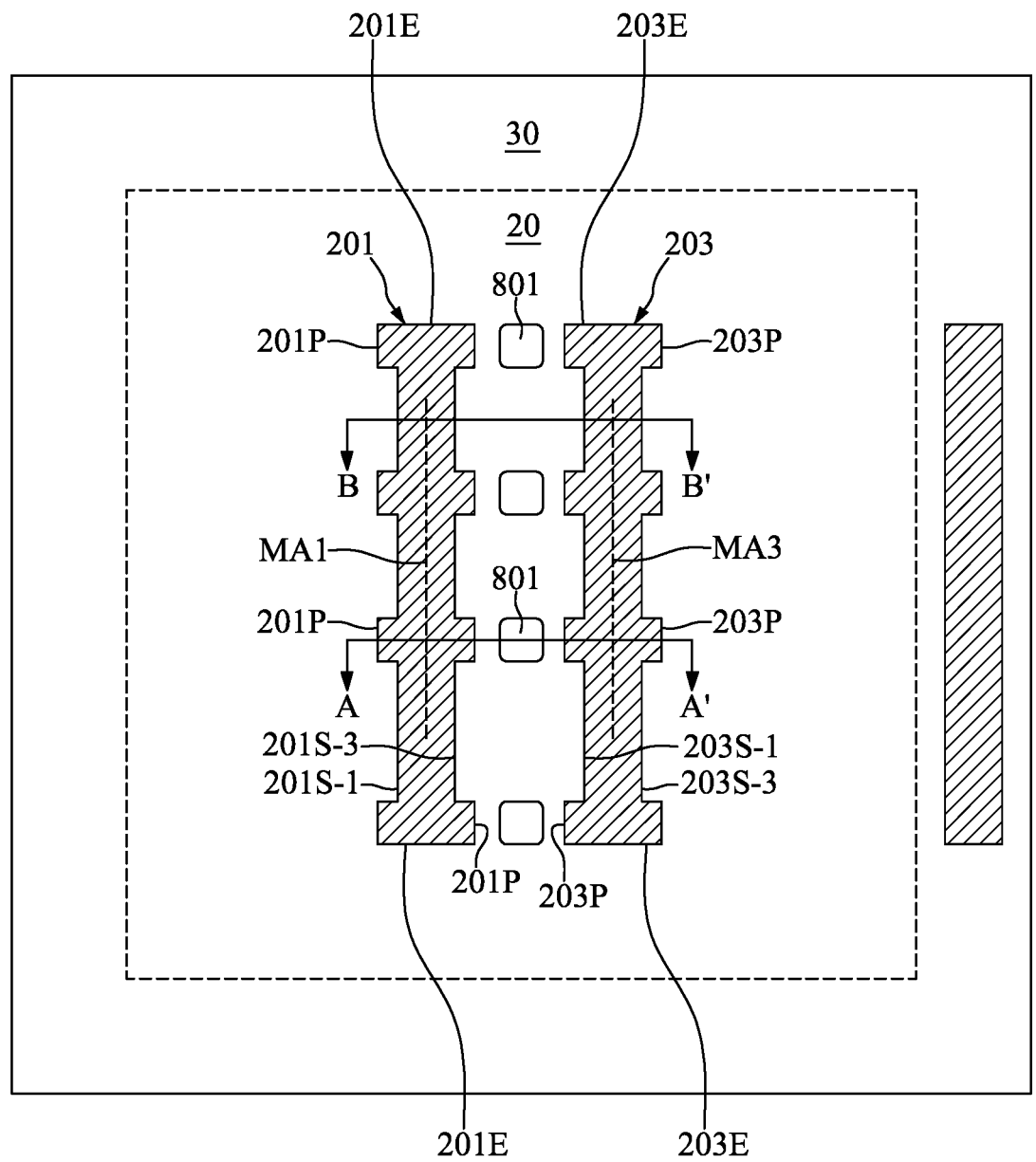
FIG. 7 illustrates, in a schematic top view diagram, an intermediate semiconductor device in accordance with one embodiment of the present disclosure.
Figure 8:
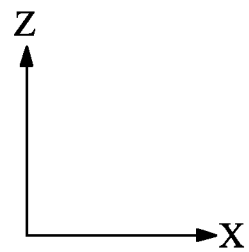
FIG. 8 is a schematic cross-sectional view diagram taken along a line A-A' in FIG. 7.
Figure 8:
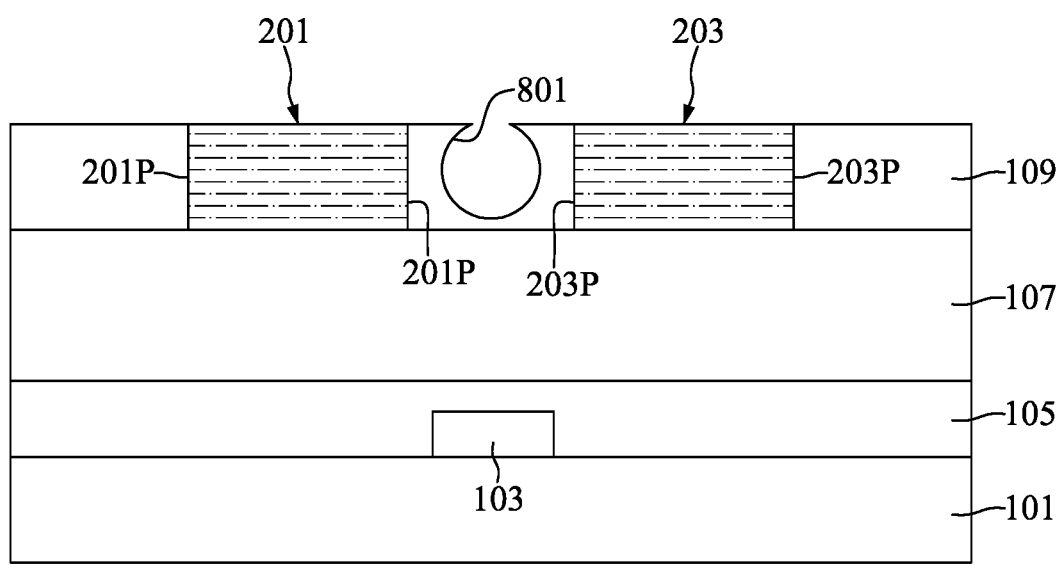
Figure 9:
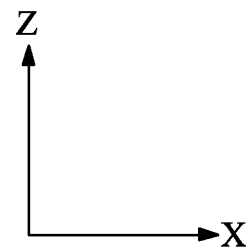
FIG. 9 is a schematic cross-sectional view diagram taken along a line B-B' in FIG. 7.
Figure 9:
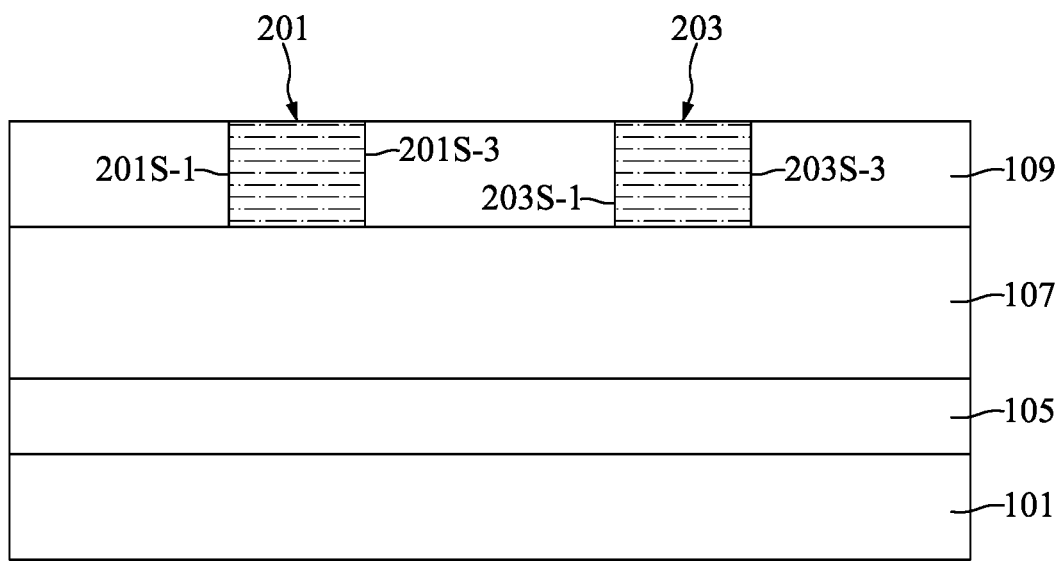

FIG. 7 illustrates, in a schematic top view diagram, an intermediate semiconductor device in accordance with one embodiment of the present disclosure. FIG. 8 is a schematic cross-sectional view diagram taken along a line A-A' in FIG. 7. FIG. 9 is a schematic cross-sectional view diagram taken along a line B-B' in FIG. 7. Some elements of the semiconductor device of the present disclosure are not shown in FIG. 7 for clarity.

With reference to FIGS. 1 and 7 to 9, at step S15, in the embodiment depicted, a plurality of voids 801 may be formed between the plurality of first protruding portions 201P at the side 201S-3 and the plurality of second protruding portions 203P at the side 203S-1. An insulating material may be deposited over the intermediate semiconductor device illustrated in FIGS. 4 to 6 by a deposition process such as chemical vapor deposition. A planarization process, such as chemical mechanical polishing, may be subsequently performed until the top surfaces of the first conductive line 201 and the second conductive line 203 are exposed to remove excess material, provide a substantially flat surface for subsequent processing steps, and conformally form the third insulating layer 109 and the plurality of voids 801 in the third insulating layer 109. The insulating material may be formed of a same material as the second insulating layer 107 but is not limited thereto. Due to the narrower spaces (or smaller distances D1) between the plurality of first protruding portions 201P at the side 201S-3 and the plurality of second protruding portions 203P at the side 203S-1, the insulating material cannot completely fill the spaces. Therefore, the spaces may remain partially unfilled after the deposition process and the planarization process and the unfilled spaces may be referred to as the plurality of voids 801. In other words, the plurality of voids 801 are formed near the first protruding portions 201P and the second protruding portions 203P in a self-aligned manner.

Figure 10:
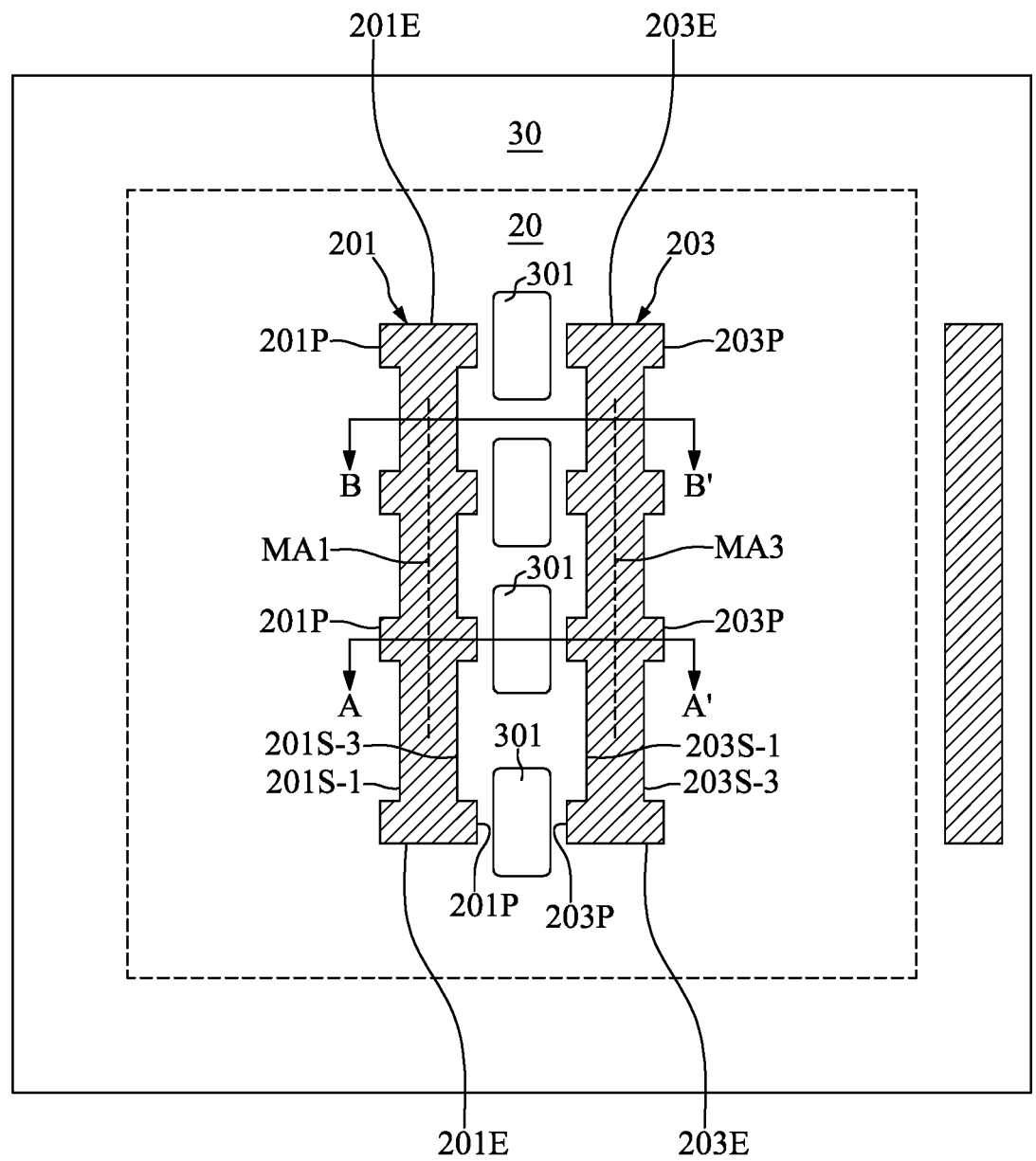
FIG. 10 illustrates, in a schematic top view diagram, an intermediate semiconductor device in accordance with one embodiment of the present disclosure.
Figure 11:
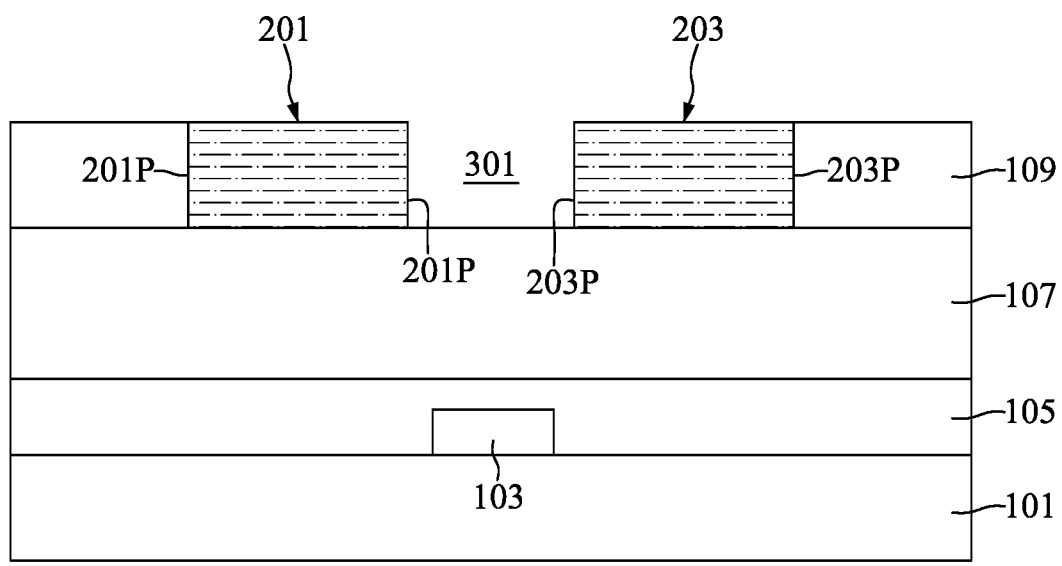
FIG. 11 is a schematic cross-sectional view diagram taken along a line A-A' in FIG. 10.
Figure 12:
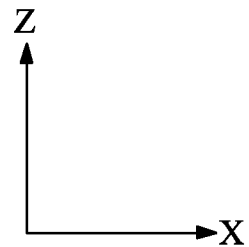
FIG. 12 is a schematic cross-sectional view diagram taken along a line B-B' in FIG. 10.
Figure 12:
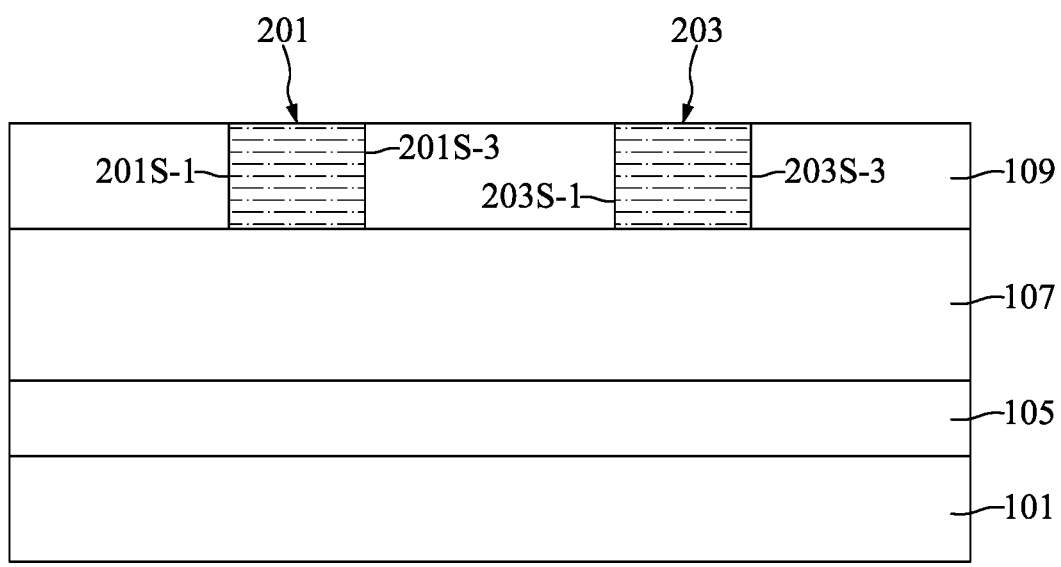

FIG. 10 illustrates, in a schematic top view diagram, an intermediate semiconductor device in accordance with one embodiment of the present disclosure. FIG. 11 is a schematic cross-sectional view diagram taken along a line A-A' in FIG. 10. FIG. 12 is a schematic cross-sectional view diagram taken along a line B-B' in FIG. 10. Some elements of the semiconductor device of the present disclosure are not shown in FIG. 10 for clarity.

With reference to FIGS. 1 and 10 to 12, at step S17, in the embodiment depicted, an etch process may be performed to expand the plurality of voids 801 into a plurality of first air gaps 301. Due to the presence of the plurality of voids 801, the etching rate of places of the third insulating layer 109 adjacent to the plurality of voids 801 may higher than other places of the third insulating layer 109. Hence, the plurality of voids 801 may be spontaneously expanded parallel to the major axes MA1, MA3 of the first conductive line 201 and the second conductive line 203 during the etch process. In the present embodiment depicted, the plurality of voids 801 may extend along the first direction Y. After the expansion, the plurality of voids 801 may be turned into the plurality of first air gaps 301. In the embodiment depicted, the positions of the plurality of first air gaps 301 may be defined by the plurality of first protruding portions 201P at the side 201S-3 and the plurality of second protruding portions 203P at the side 203S-1. Therefore, no other mask is needed to define the positions of the plurality of first air gaps 301 during the formation of the plurality of first air gaps 301. In other words, the plurality of first air gaps 301 are formed near the first protruding portions 201P and the second protruding portions 203P in a self-aligned manner. The plurality of first air gaps 301 may alleviate the parasitic capacitance between the first conductive line 201 and the second conductive line 203. As a result, the performance of the semiconductor device may be improved.

In some embodiments, the plurality of first air gaps 301 may be connected into a single air gap. In some embodiments, a protection layer may be formed over the intermediate semiconductor device before the etch process to protect the first conductive line 201 and the second conductive line 203.

Figure 13:
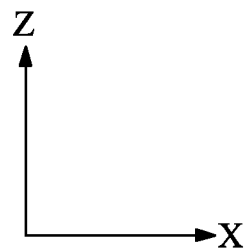
FIG. 13 is a schematic cross-sectional view diagram taken along the line A-A' in FIG. 10 illustrating part of a flow for fabricating the semiconductor device in accordance with one embodiment of the present disclosure.
Figure 13:
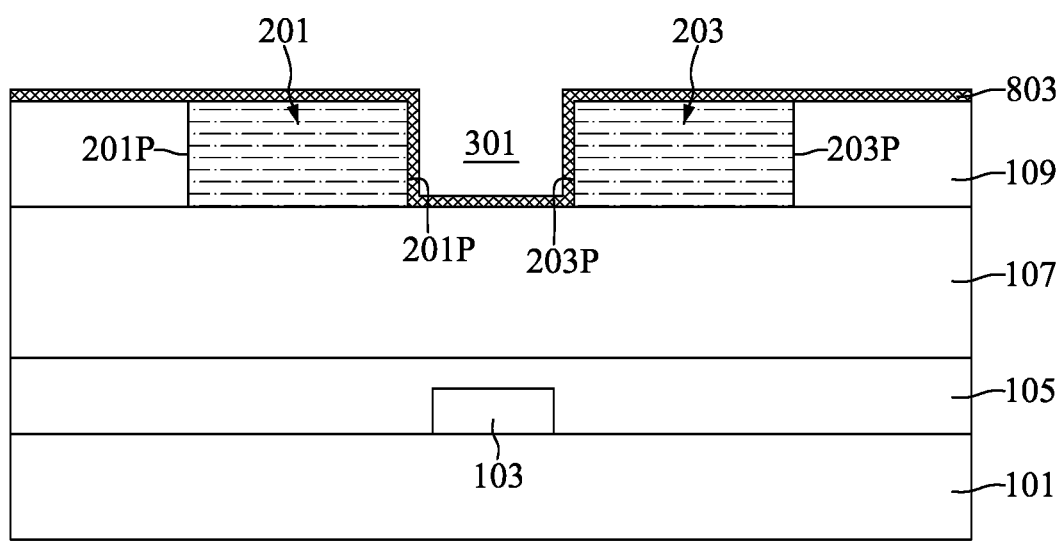
Figure 14:
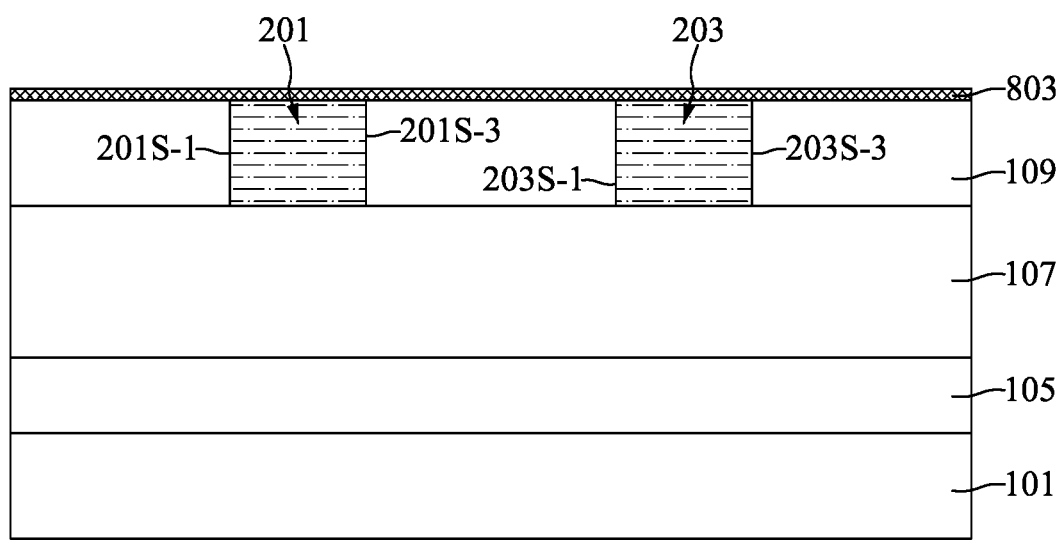
FIG. 14 is a schematic cross-sectional view diagram taken along the line B-B' in FIG. 10 illustrating part of a flow for fabricating the semiconductor device in accordance with one embodiment of the present disclosure.
Figure 15:
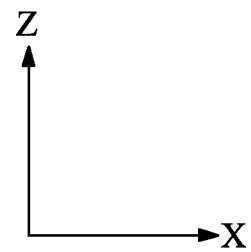
FIG. 15 is a schematic cross-sectional view diagram taken along the line A-A' in FIG. 10 illustrating part of a flow for fabricating the semiconductor device in accordance with one embodiment of the present disclosure.
Figure 15:
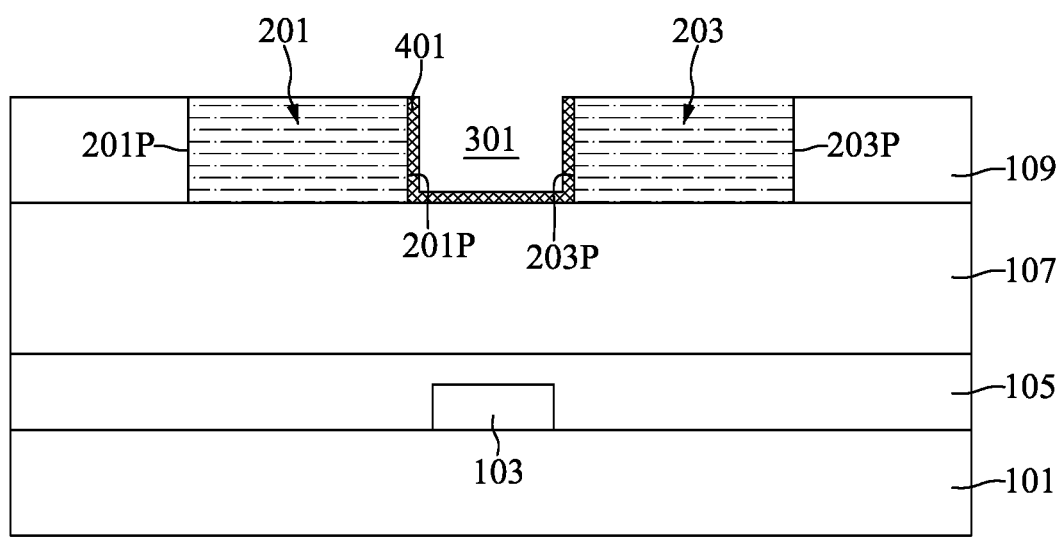
Figure 16:
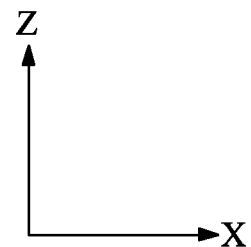
FIG. 16 is a schematic cross-sectional view diagram taken along the line B-B' in FIG. 10 illustrating part of a flow for fabricating the semiconductor device in accordance with one embodiment of the present disclosure.
Figure 16:
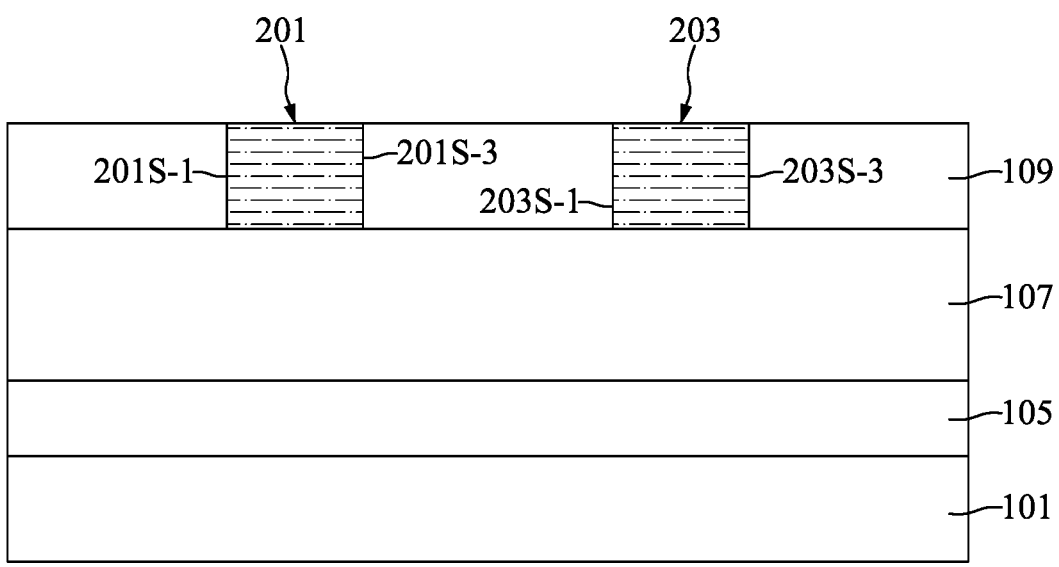

FIG. 13 is a schematic cross-sectional view diagram taken along the line A-A' in FIG. 10 illustrating part of a flow for fabricating the semiconductor device in accordance with one embodiment of the present disclosure. FIG. 14 is a schematic cross-sectional view diagram taken along the line B-B' in FIG. 10 illustrating part of a flow for fabricating the semiconductor device in accordance with one embodiment of the present disclosure. FIG. 15 is a schematic cross-sectional view diagram taken along the line A-A' in FIG. 10 illustrating part of a flow for fabricating the semiconductor device in accordance with one embodiment of the present disclosure. FIG. 16 is a schematic cross-sectional view diagram taken along the line B-B' in FIG. 10 illustrating part of a flow for fabricating the semiconductor device in accordance with one embodiment of the present disclosure.

With reference to FIGS. 1 and 13 to 16, at step S19, in the embodiment depicted, a plurality of first liner layers 401 may be formed in the plurality of first air gaps 301. For convenience of description, only one first liner layer 401 is described. With reference to FIGS. 13 and 14, in the embodiment depicted, a layer of first liner material 803 may be formed over the intermediate semiconductor device illustrated in FIGS. 11 and 12. The first liner material 803 may be, for example, silicon oxide, silicon nitride, silicon oxynitride, silicon nitride oxide, the like, or a combination thereof.

With reference to FIGS. 15 and 16, in the embodiment depicted, a planarization process, such as chemical mechanical polishing, may be performed until the top surface of the third insulating layer 109 is exposed to remove excess material, provide a substantially flat surface for subsequent processing steps, and conformally form the first liner layer 401. The first liner layer 401 may be formed on the sides, which is parallel to the YZ plane, of the plurality of first air gaps 301 (i.e., the sides of the plurality of first protruding portions 201P and the plurality of second protruding portions 203P) and the bottom surfaces of the plurality of first air gaps 301 (i.e., the top surface of the second insulating layer 107). The first liner layer 401 may be employed to prevent the first conductive line 201 and the second conductive line 203 from flaking or spalling and migrating to the plurality of first air gaps 301 during subsequent semiconductor processes. It should be noted that the first liner layer 401 may also formed on the sides parallel to the XZ plane (Not shown in FIG. 15).

In some embodiments, the first liner material 803 may be, for example, an energy-removable material. The energy-removable material may include a material such as a thermal-decomposable material, a photonic-decomposable material, an e-beam decomposable material, or a combination thereof. For example, the energy-removable material may include a base material and a decomposable porogen material that is sacrificially removed upon being exposed to an energy source. The base material may include a methyl-silsesquioxane based material, low-dielectric material, or silicon oxide. The decomposable porogen material may include a porogen organic compound that provides porosity to the base material of the energy-removable material. The composition of the base material and the decomposable porogen material may be between about 25:75 and about 55:45.

While the first liner material 803 is the energy-removable material, an energy treatment may be performed to make the first liner layer 401 porous. A porosity of the first liner layer 401 may be between about 45% and about 75%. The energy source of the energy treatment may include heat, light, or a combination thereof. When heat is used as the energy source, a temperature of the energy treatment may be between about 800° C. and about 900° C. When light is used as the energy source, an ultraviolet light may be applied. The porous first liner layer 401 may provide structural support for the first conductive line 201 and the second conductive line 203 and keep alleviating the parasitic capacitance between the first conductive line 201 and the second conductive line 203.

Figure 17:
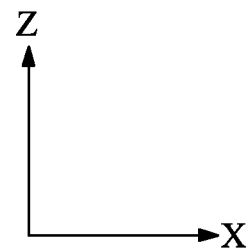
FIG. 17 is a schematic cross-sectional view diagram taken along the line A-A' in FIG. 10 illustrating part of a flow for fabricating the semiconductor device in accordance with one embodiment of the present disclosure.
Figure 17:
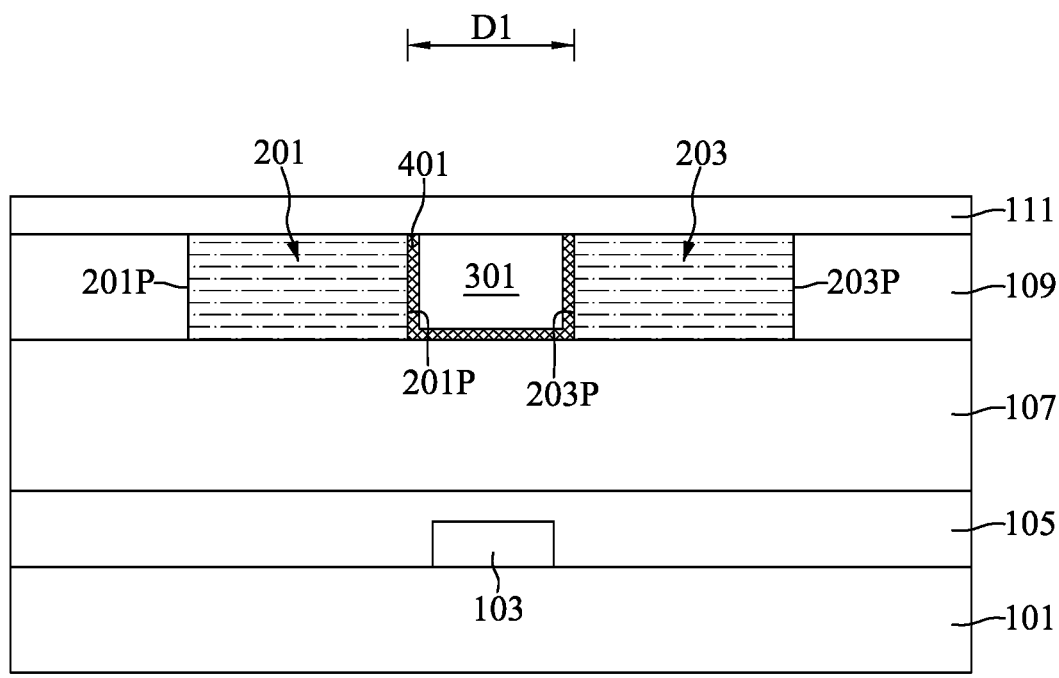
Figure 18:
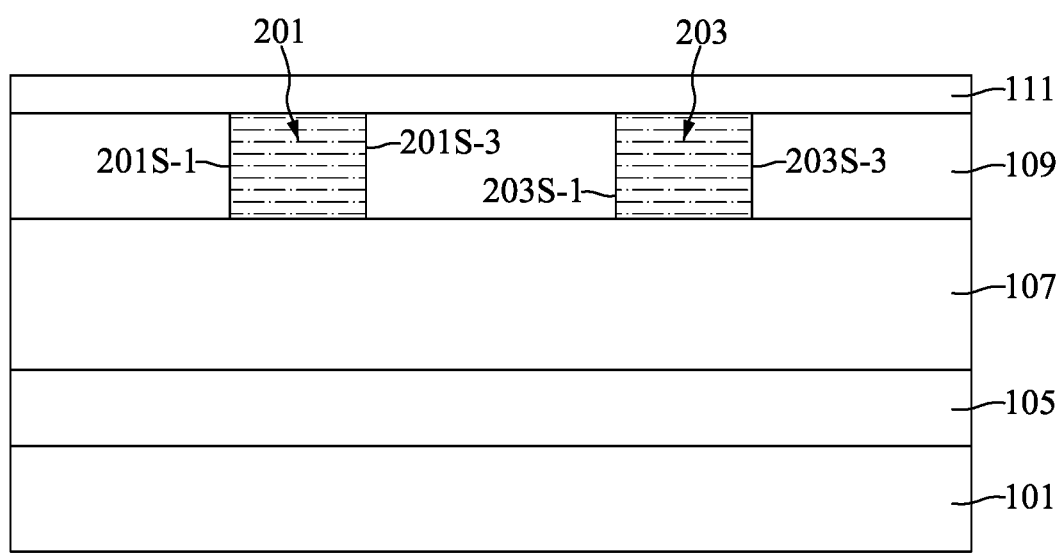
FIG. 18 is a schematic cross-sectional view diagram taken along the line B-B' in FIG. 10 illustrating part of a flow for fabricating the semiconductor device in accordance with one embodiment of the present disclosure.

FIG. 17 is a schematic cross-sectional view diagram taken along the line A-A' in FIG. 10 illustrating part of a flow for fabricating the semiconductor device in accordance with one embodiment of the present disclosure. FIG. 18 is a schematic cross-sectional view diagram taken along the line B-B' in FIG. 10 illustrating part of a flow for fabricating the semiconductor device in accordance with one embodiment of the present disclosure.

With reference to FIGS. 1, 17 and 18, at step S21, a coverage layer 111 may be formed to seal the plurality of first air gaps 301. The coverage layer 111 may be a non-gap filling material such as silicon oxide formed using tetraethoxysilane (TEOS), fluorine-doped silicon oxide formed using fluorinated-TEOS, organic spin-on glass, or the like. The coverage layer 111 may be formed by chemical vapor deposition, high density plasma, spin-on, or the like. The parameters that determine if a material is non-gap filling depends on the method used to deposit the material and the width and depth of the spaces in which the air gaps are formed. For example, if chemical vapor deposition is used, the step coverage of the material determines whether the material will form an air gap. For example, a more conformal material, will make smaller air gaps or tend not to form air gaps at all. For spin-on materials, viscosity and surface properties affect the formation of an air gap. Surface energy interactions between materials may also impact air gap formation, especially for materials that are spun-on. In some embodiments, the distance D1 between the plurality of first protruding portions 201P at the side 201S-3 and the plurality of second protruding portions 203P at the side 203S-1 may be equal to or less than a width of the first conductive line 201 (i.e., a distance between the two sides 201S1-1, 201S-3) or a width of the second conductive line 203 (i.e., a distance between the two sides 203S1-1, 203S-3).

Figure 19:
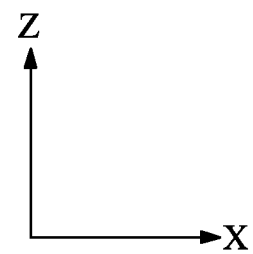
FIGS. 19 to 21 are schematic cross-sectional view diagrams illustrating part of a flow for fabricating a semiconductor device in accordance with one embodiment of the present disclosure.
Figure 19:
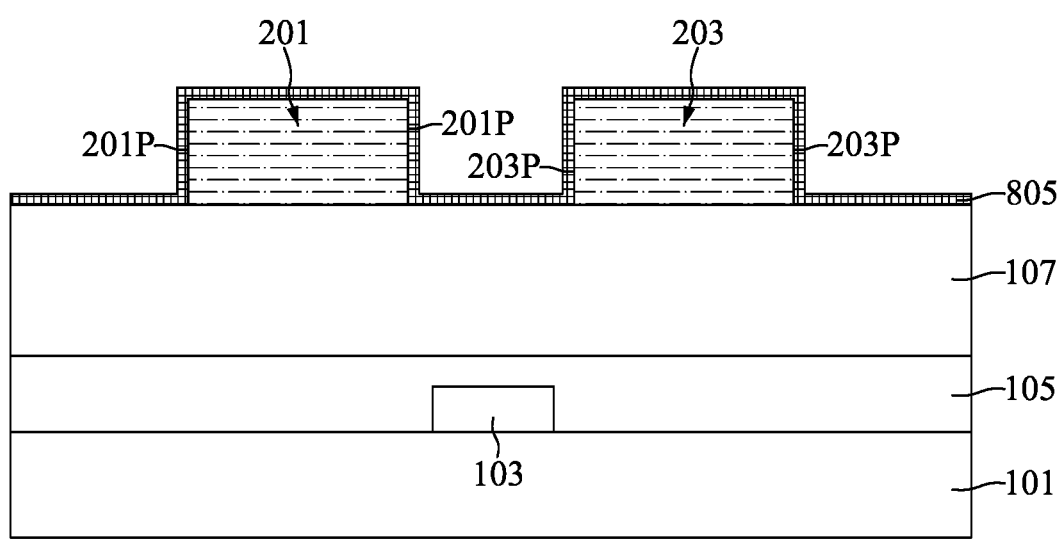
Figure 20:
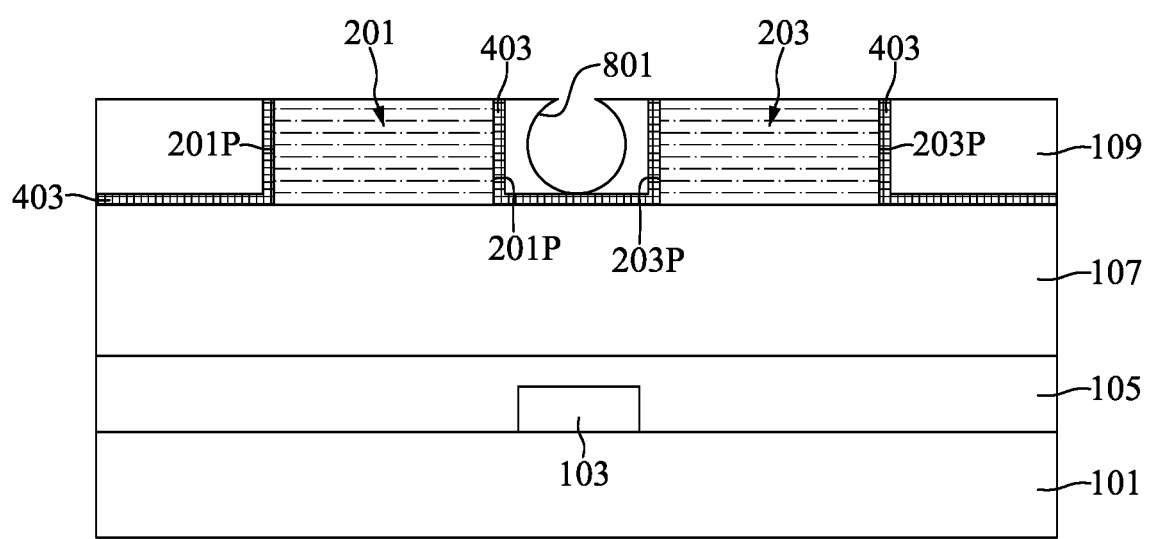
Figure 21:
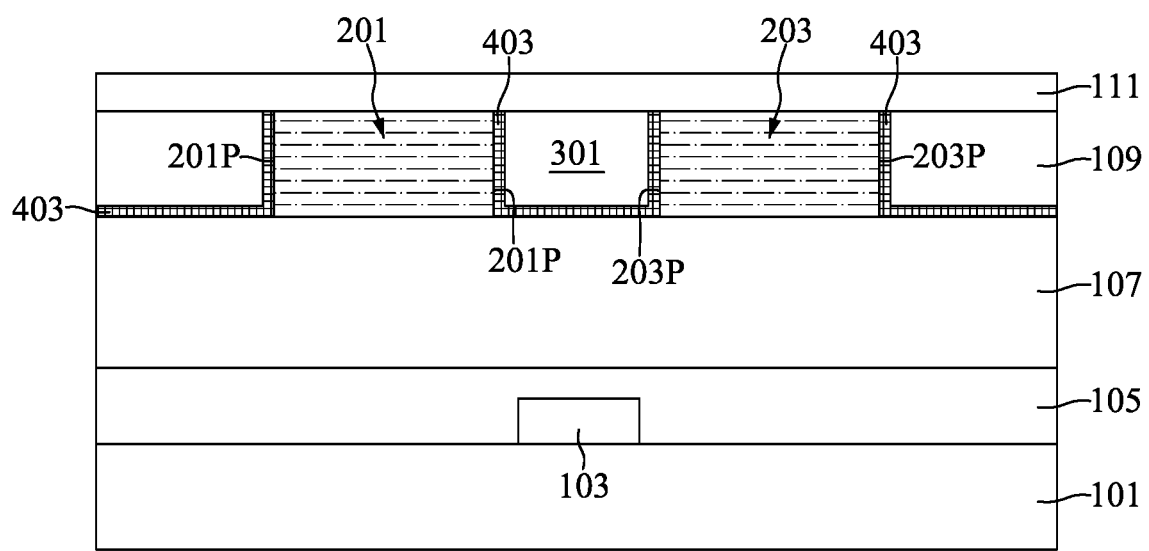

FIGS. 19 to 21 are schematic cross-sectional view diagrams illustrating part of a flow for fabricating a semiconductor device in accordance with one embodiment of the present disclosure.

With reference to FIG. 19, an intermediate semiconductor device as illustrated in FIG. 5 may be provided. A layer of second liner material 805 may be formed over the intermediate semiconductor device. The second liner material 805 may be a same material as the first liner material 803 but is not limited thereto. With reference to FIG. 20, a procedure similar to that illustrated in FIG. 8 may be performed to form a plurality of second liner layers 403, the third insulating layer 109, and the plurality of voids 801. The plurality of second liner layers 403 may be formed on the top surface of the second insulating layer 107, the sides of the plurality of first protruding portions 201P, and the sides of the plurality of second protruding portions 203P. With reference to FIG. 21, a procedure similar to that illustrated in FIGS. 10 to 12, 17 and 18 may be performed to form the plurality of first air gaps 301 and the coverage layer 111.

Figure 22:
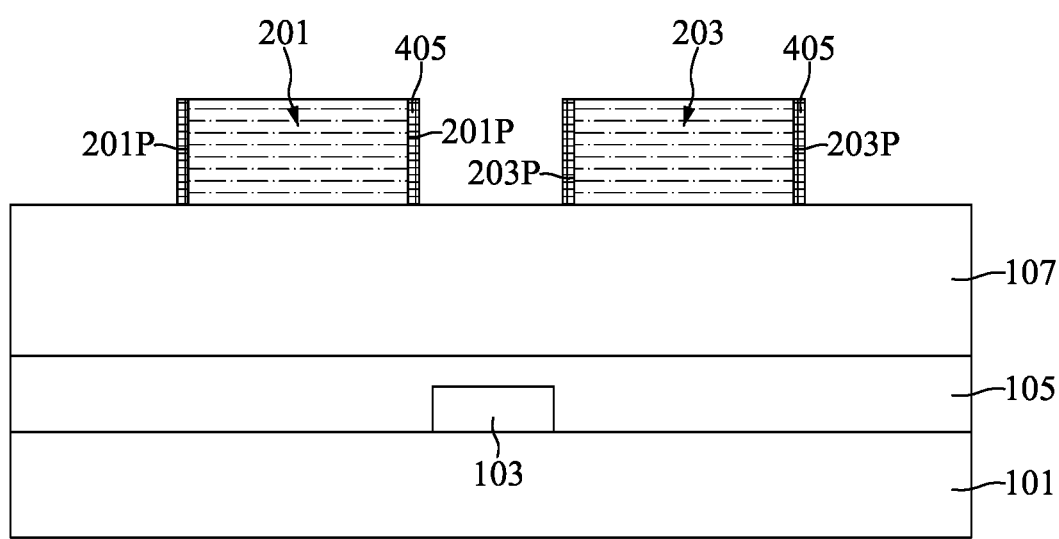
FIGS. 22 to 24 are schematic cross-sectional view diagrams illustrating part of a flow for fabricating a semiconductor device in accordance with one embodiment of the present disclosure.
Figure 23:
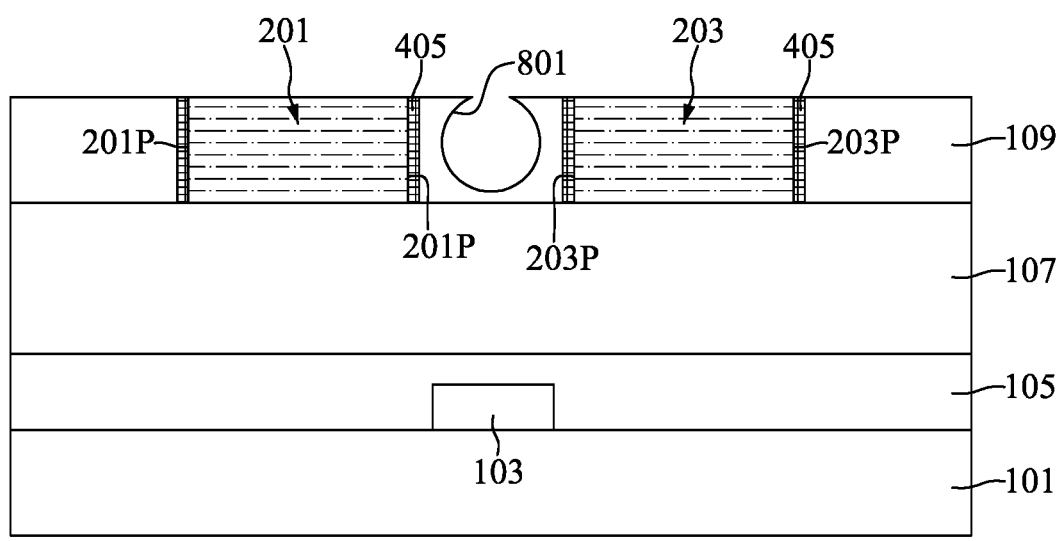
Figure 24:
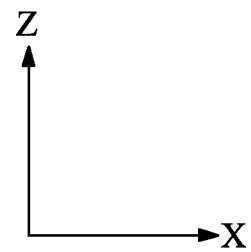
Figure 24:
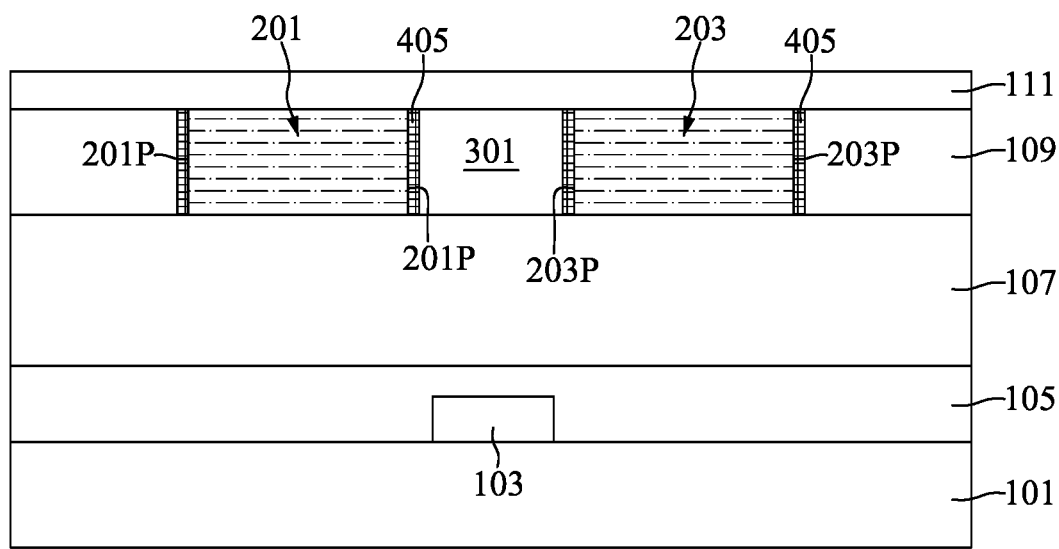

FIGS. 22 to 24 are schematic cross-sectional view diagrams illustrating part of a flow for fabricating a semiconductor device in accordance with one embodiment of the present disclosure.

With reference to FIG. 22, an intermediate semiconductor device as illustrated in FIG. 19 may be provided. An etch process, such as an anisotropic dry etch process, may be performed to remove portions of the layer of second liner material 805 and concurrently form a plurality of third liner layers 405. The plurality of third liner layers 405 may be formed on the sides of the plurality of first protruding portions 201P and the sides of the plurality of second protruding portions 203P. With reference to FIG. 23, a procedure similar to that illustrated in FIG. 8 may be performed to form the third insulating layer 109 and the plurality of voids 801. With reference to FIG. 24, a procedure similar to that illustrated in FIGS. 10 to 12, 17 and 18 may be performed to form the plurality of first air gaps 301 and the coverage layer 111.

Figure 25:
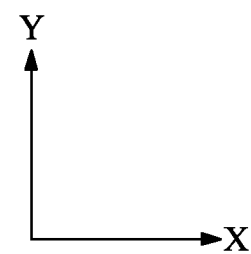
FIG. 25 is a schematic top-view diagram illustrating part of a flow for fabricating a semiconductor device in accordance with one embodiment of the present disclosure.
Figure 25:
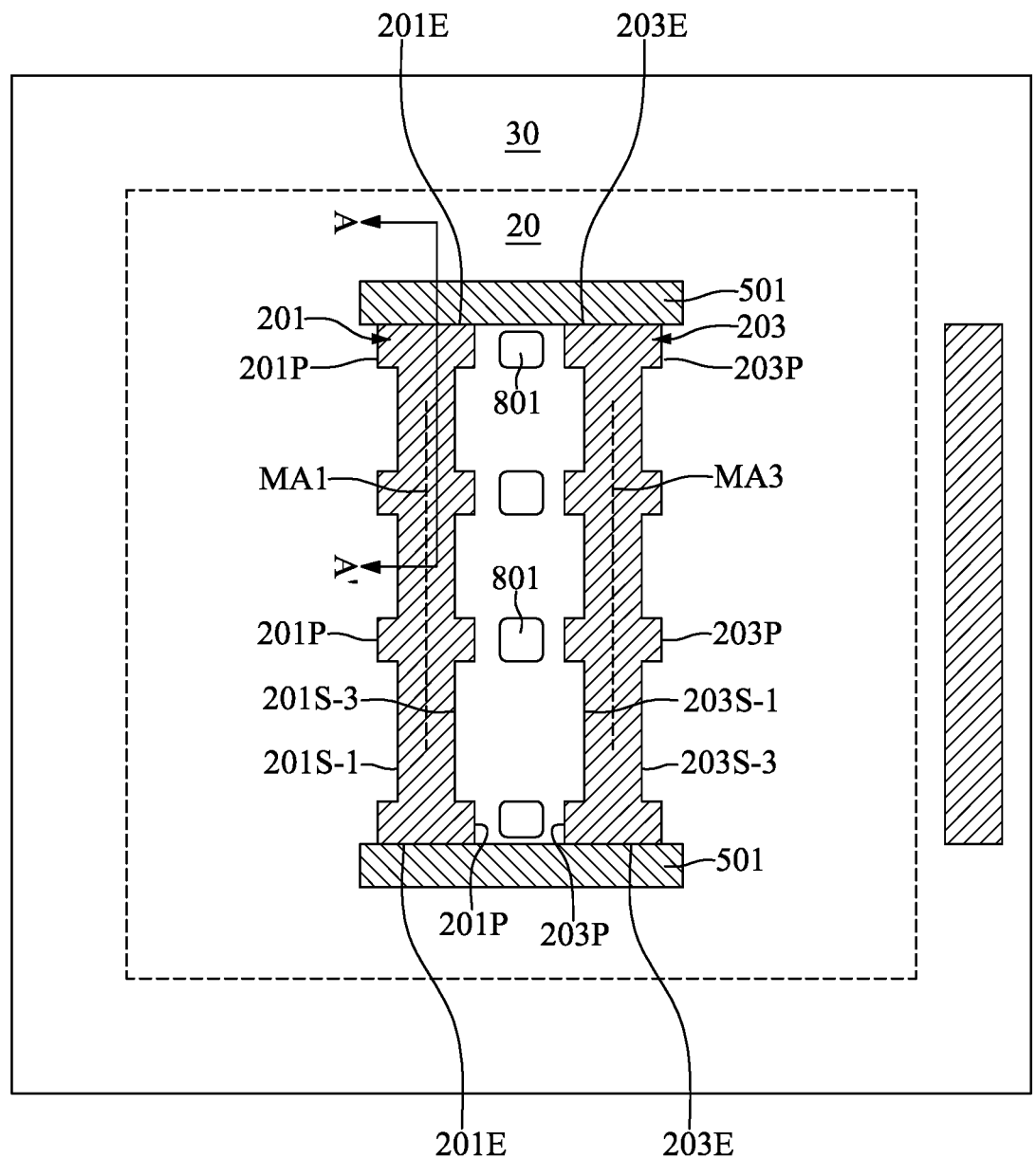
Figure 26:
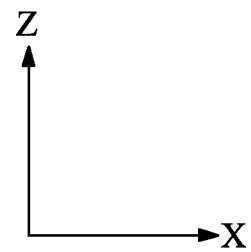
FIG. 26 is a schematic cross-sectional view diagram taken along a line A-A' in FIG. 25.
Figure 26:
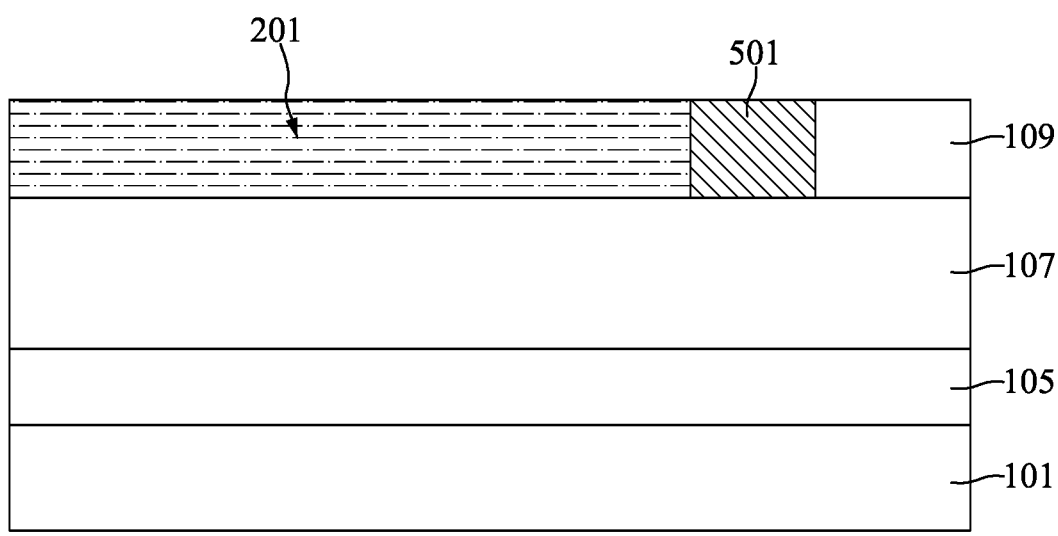
Figure 27:
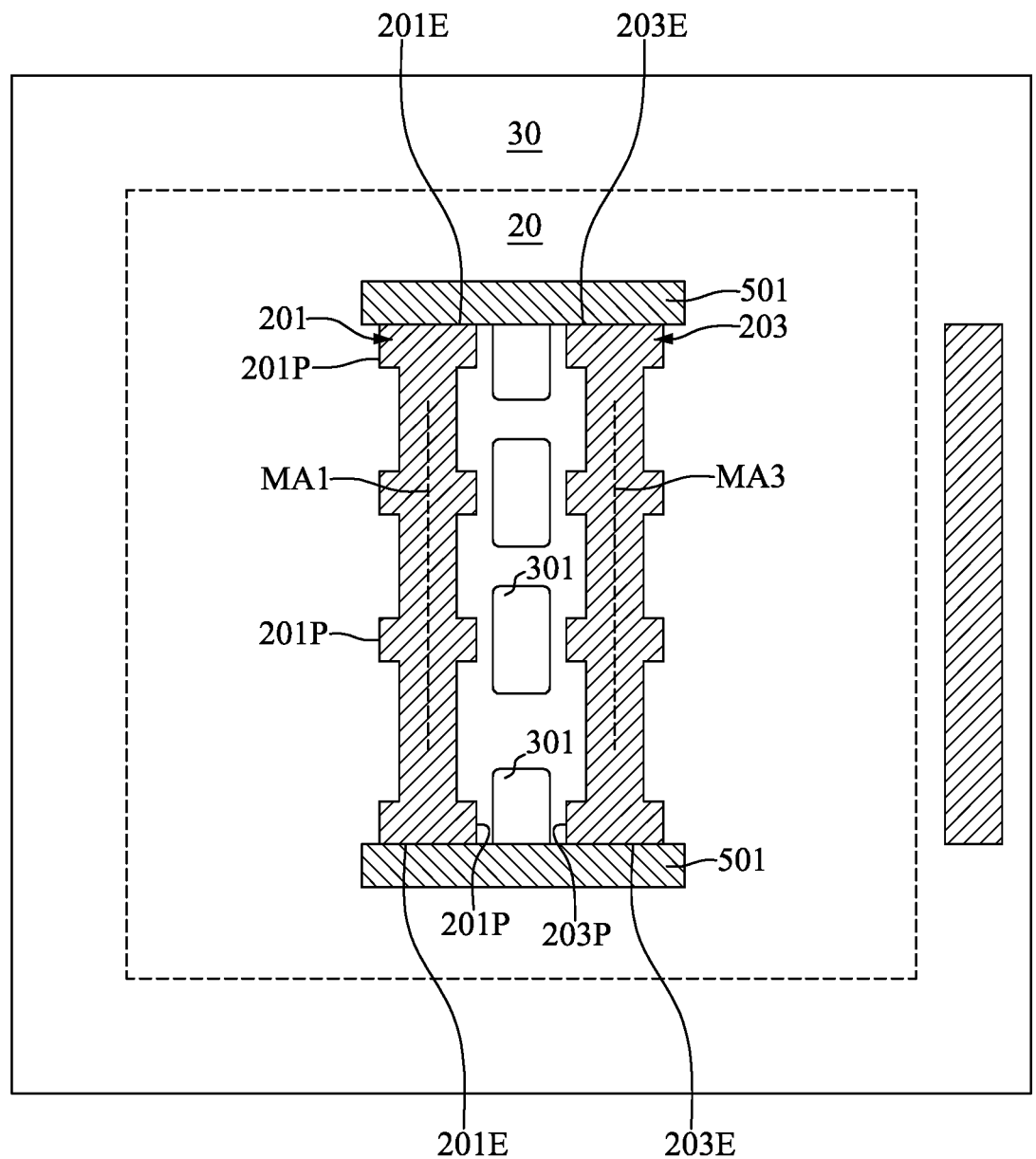
FIG. 27 is a schematic top-view diagram illustrating part of a flow for fabricating a semiconductor device in accordance with one embodiment of the present disclosure.

FIG. 25 is a schematic top-view diagram illustrating part of a flow for fabricating a semiconductor device in accordance with one embodiment of the present disclosure. FIG. 26 is a schematic cross-sectional view diagram taken along a line A-A' in FIG. 25. FIG. 27 is a schematic top-view diagram illustrating part of a flow for fabricating a semiconductor device in accordance with one embodiment of the present disclosure.

With reference to FIGS. 25 and 26, an intermediate semiconductor device as illustrated in FIGS. 7 and 8 may be provided. A photolithography process may be performed to define positions of a plurality of sealing layers 501 with assistance of a mask layer formed over the third insulating layer 109, the first conductive line 201, the plurality of second protruding portions 203P, and the plurality of voids 801. After the photolithography process, an etch process, such as an anisotropic dry etch process, may be performed to form a plurality of opening in the third insulating layer 109. A filling material may be filled into the plurality of opening. A planarization process, such as chemical mechanical polishing, may be performed to remove excess filling material, provide a substantially flat surface for subsequent processing steps, and conformally form the plurality of sealing layers 501 in the third insulating layer 109. The plurality of sealing layers 501 may be respectively correspondingly formed on the ends 201E, 203E of the first conductive line 201 and the second conductive line 203. From a top-view perspective, the plurality of sealing layers 501 may seal both ends 201E, 203E of the first conductive line 201 and the second conductive line 203. The filling material may be a material having slower etching rate with respect to the etching rate of the third insulating layer 109 while the etch process illustrated in FIGS. 10 to 12. With reference to FIG. 27, a procedure similar to that illustrated in FIGS. 10 to 12 may be performed to form the plurality of first air gaps 301. Due to the expansion of the plurality of first air gaps 301 formed adjacent to the plurality of sealing layers 501 may be blocked by the plurality of sealing layers 501. Therefore, the plurality of first air gaps 301 formed adjacent to the plurality of sealing layers 501 may be smaller than others of the plurality of first air gaps 301.

Figure 28:
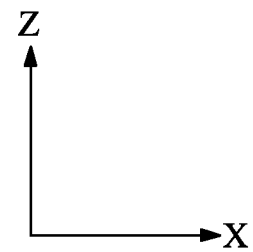
FIGS. 28 to 30 are schematic cross-sectional view diagrams illustrating part of a flow for fabricating a semiconductor device in accordance with one embodiment of the present disclosure.
Figure 28:
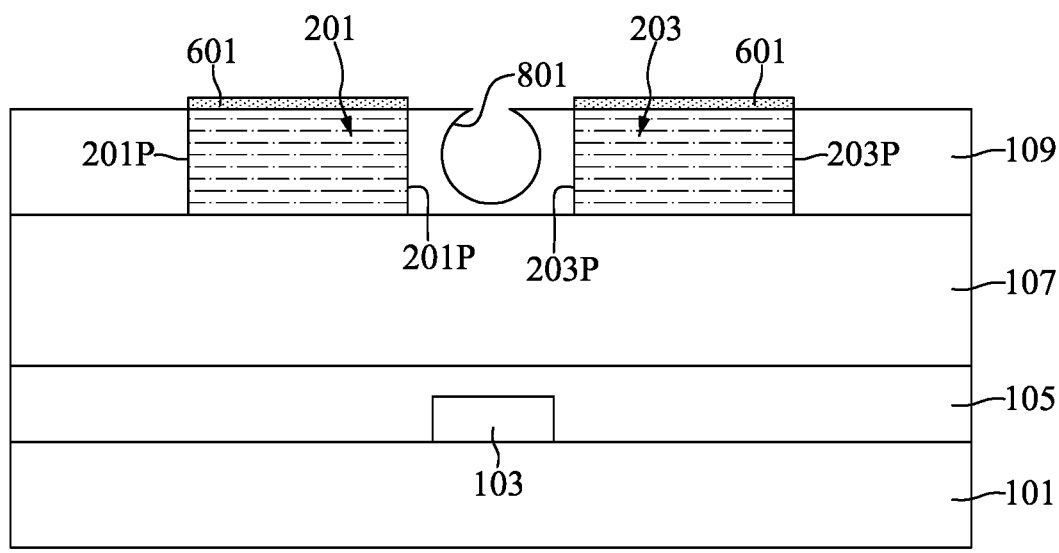
Figure 29:
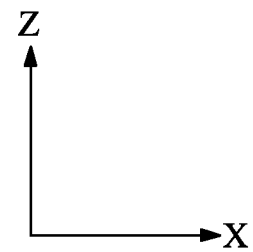
Figure 29:
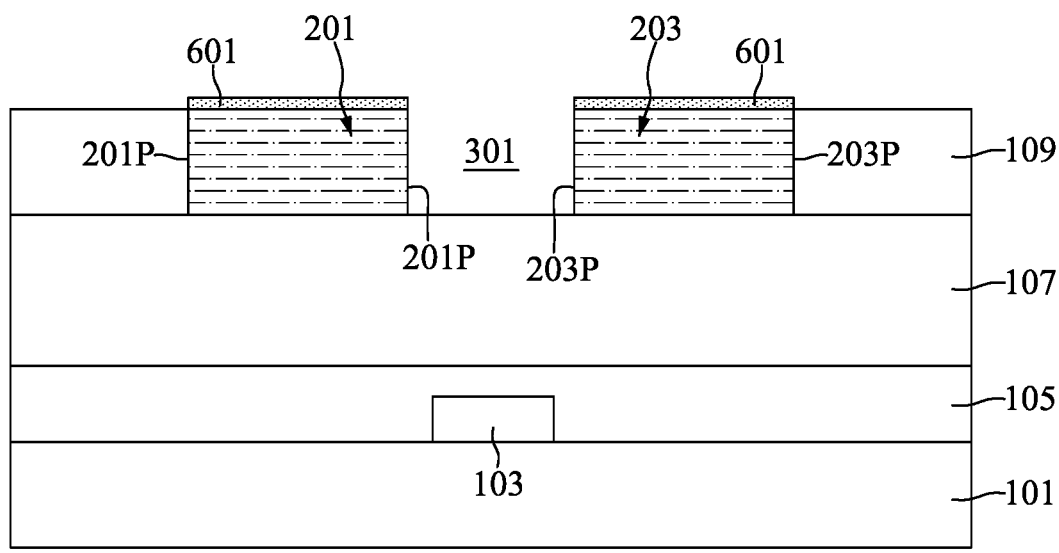
Figure 30:
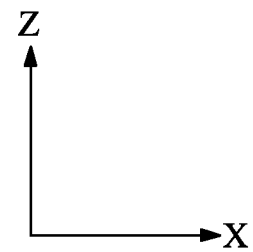
Figure 30:
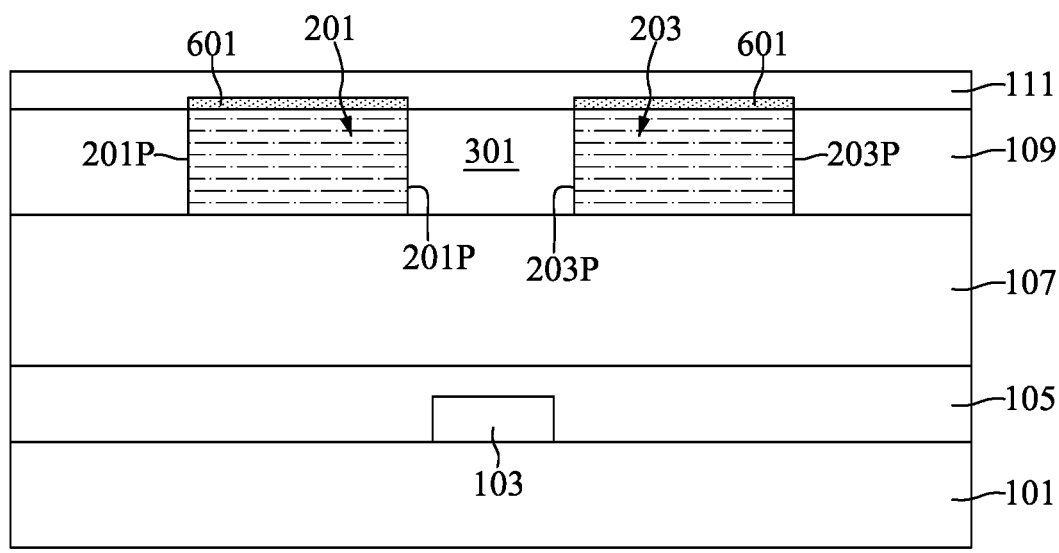

FIGS. 28 to 30 are schematic cross-sectional view diagrams illustrating part of a flow for fabricating a semiconductor device in accordance with one embodiment of the present disclosure.

With reference to FIG. 28, an intermediate semiconductor device as illustrated in FIGS. 7 and 8 may be provided. A plurality of protection layers 601 may be respectively correspondingly formed on the first conductive line 201 and the second conductive line 203. In some embodiments, the plurality of protection layers 601 may slightly extend to the top surface of the third insulating layer 109. The plurality of protection layers 601 may be formed of a material that includes cobalt, tantalum, nitrogen, boron, nickel, phosphorus, tungsten or rhenium. For example, the material may be tantalum, tantalum nitride, tungsten carbonitride, cobalt-tungsten-phosphide alloy, cobalt phosphide alloy, nickel-tungsten-phosphide alloy, nickel boron alloy, cobalt-tungsten-boron alloy, nickel-rhenium-phosphide alloy, cobalt-rhenium-phosphide alloy, or nickel. In some embodiments, the plurality of protection layers 601 may be formed by electroless deposition using a solution with reducing agents to drive the reduction of metal ions. The plurality of protection layers 601 may prevent the elements of the first conductive line 201 and the second conductive line 203 diffusing out. In addition, no mask is needed for formation of the plurality of protection layers 601. With reference to FIG. 29, a procedure similar to that illustrated in FIGS. 10 to 12 may be performed to form the plurality of first air gaps 301. With reference to FIG. 30, a procedure similar to that illustrated in FIGS. 17 and 18 may be performed to form the coverage layer 111. The coverage layer 111 may cover the plurality of protection layers 601. A planarization process, such as chemical mechanical polishing, may be optionally performed to provide a substantially flat surface for subsequent processing steps.

FIGS. 31 to 36 are schematic cross-sectional view diagrams illustrating part of a flow for fabricating a semiconductor device in accordance with one embodiment of the present disclosure.

Figure 31:
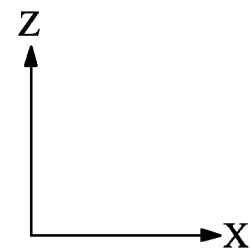
FIGS. 31 to 36 are schematic cross-sectional view diagrams illustrating part of a flow for fabricating a semiconductor device in accordance with one embodiment of the present disclosure.
Figure 31:
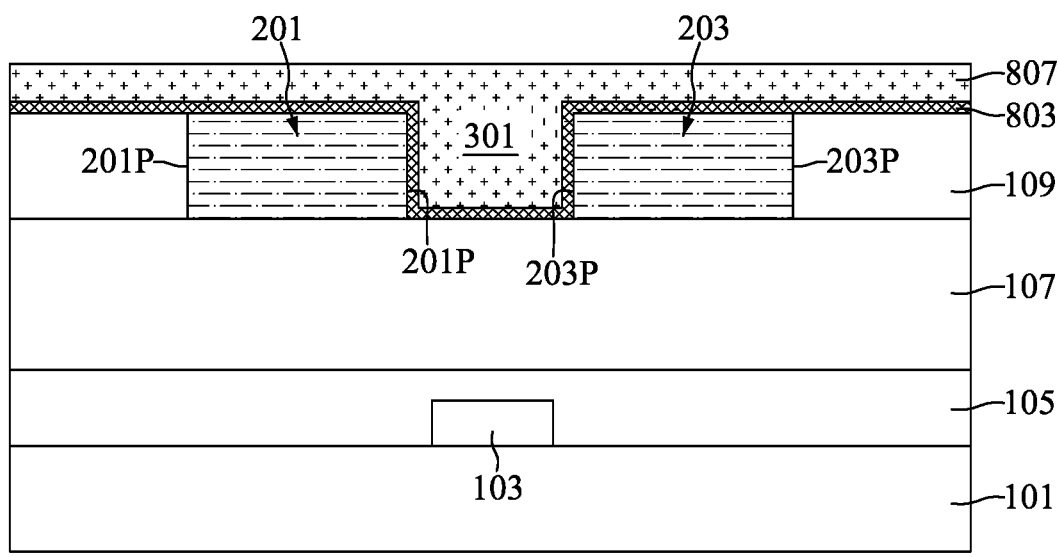

With reference to FIG. 31, an intermediate semiconductor device as illustrated in FIG. 13 may be provided. A layer of thermal-removable material 807 may be formed on the layer of first liner material 803. The thermal-removable material 807 may be a thermal decomposable polymer or a thermal degradable polymer. The thermal decomposable polymer or the thermal degradable polymer decomposes or degrades into a gaseous state when exposed to a temperature exceeding the decomposition temperature of the thermal decomposable polymer or the degradation temperature of the thermal degradable polymer.

Figure 32:
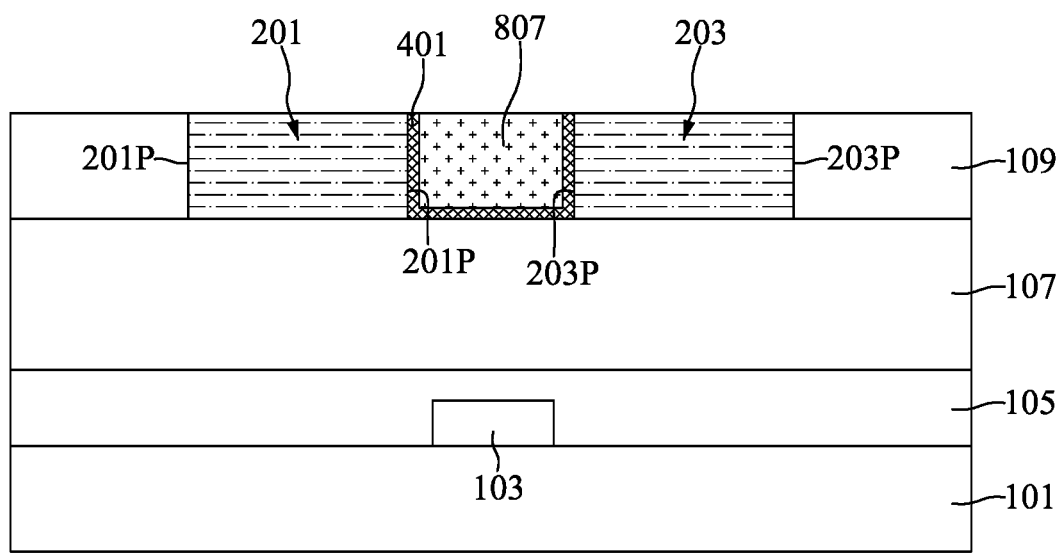

With reference to FIG. 32, a planarization process, such as chemical mechanical polishing, may be performed until the top surface of the third insulating layer 109 is exposed to remove excess material, provide a substantially flat surface for subsequent processing steps, and conformally turn the layer of first liner material 803 in to the first liner layer 401.

Figure 33:
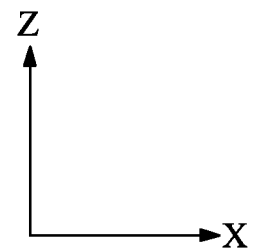
Figure 33:
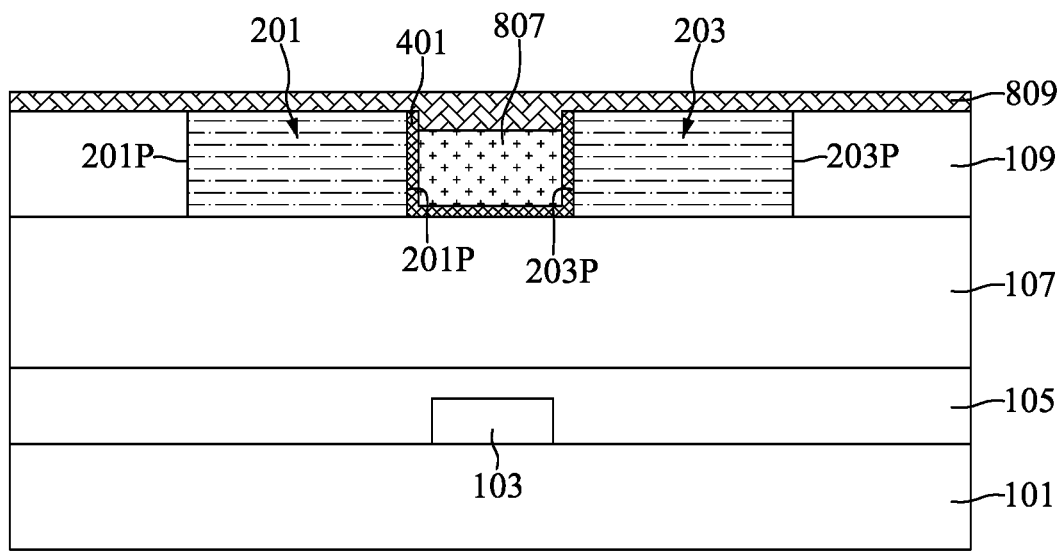

With reference to FIG. 33, an etch back process may be performed to recess the layer of thermal-removable material 807. The top surface of the layer of thermal-removable material 807 may be lower than the top surfaces of the first conductive line 201 and the second conductive line 203.

Subsequently, a layer of third liner material 809 may be formed on the layer of thermal-removable material 807, the first liner layer 401, the first conductive line 201, the second conductive line 203, and the third insulating layer 109. The third liner material 809 may be a same material as the first liner material 803 but is not limited thereto.

Figure 34:
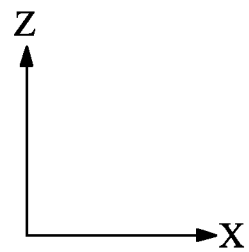
Figure 34:
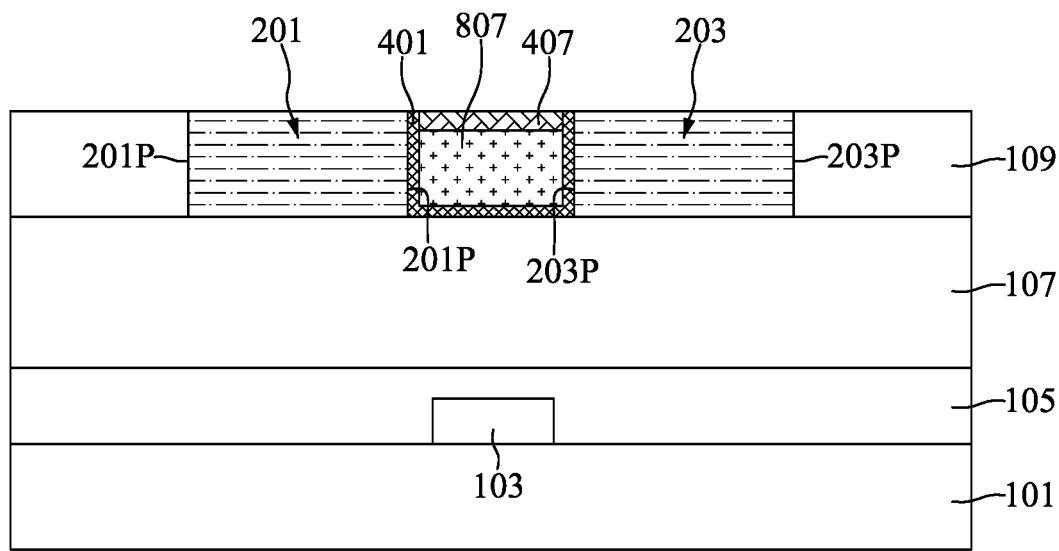

With reference to FIG. 34, a planarization process, such as chemical mechanical polishing, may be performed until the top surface of the third insulating layer 109 is exposed to remove excess material, provide a substantially flat surface for subsequent processing steps, and conformally turn the layer of third liner material 809 into a fourth liner layer 407. In some embodiments, the fourth liner layer 407 may be formed of, for example, silicon oxide, silicon nitride, silicon oxynitride, silicon nitride oxide, the like, or a combination thereof. In some embodiments, the fourth liner layer 407 may be porous and have a porosity between about 45% and about 75%.

Figure 35:
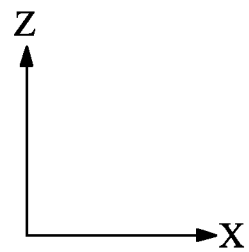
Figure 35:
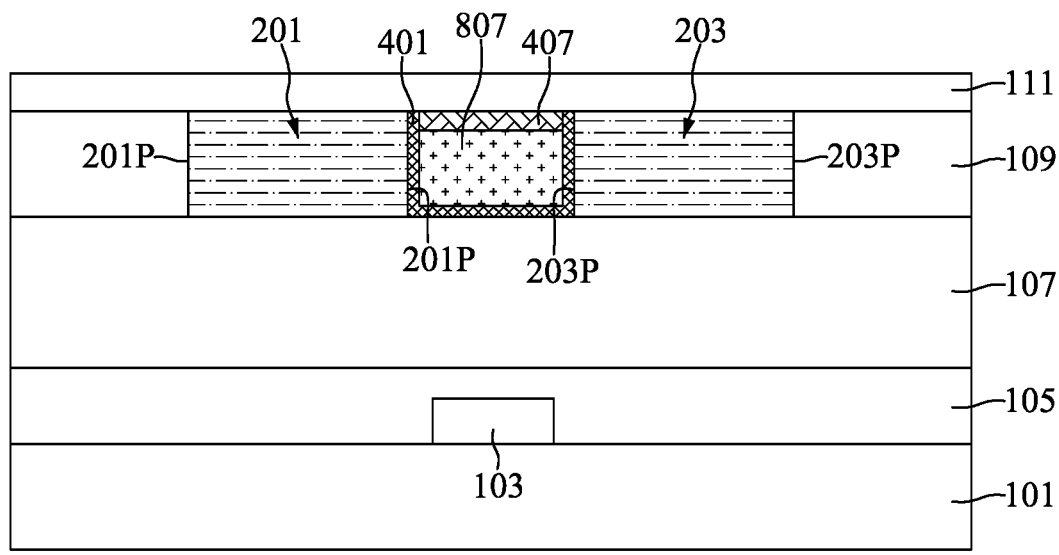
Figure 36:
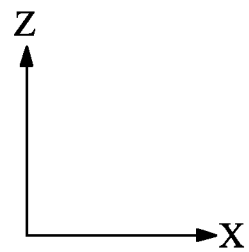
Figure 36:
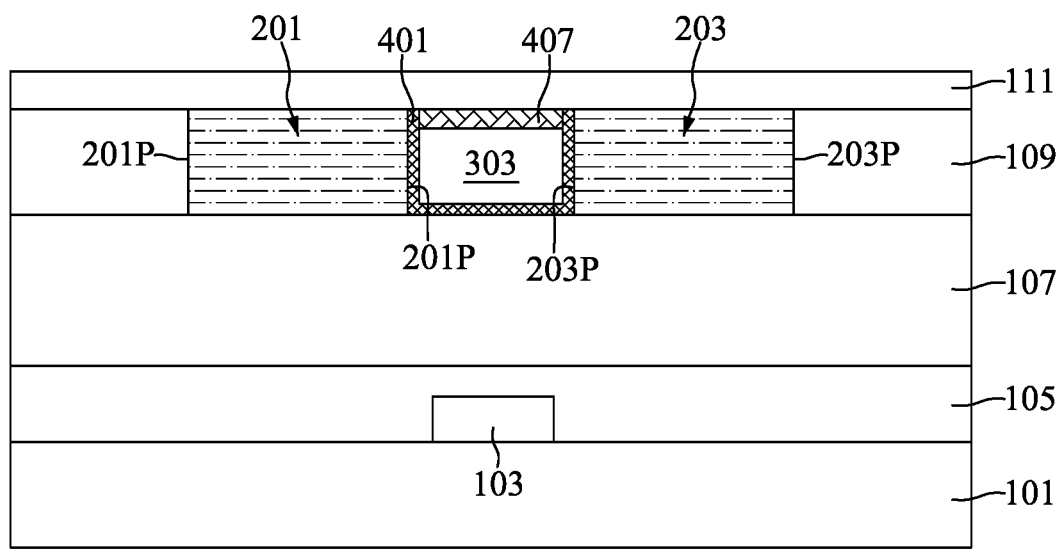

With reference to FIG. 35, a procedure similar to that illustrated in FIGS. 17 and 18 may be performed to form the coverage layer 111. The coverage layer 111 may be formed on the third insulating layer 109, the first conductive line 201, the second conductive line 203, the first liner layer 401, and the fourth liner layer 407. With reference to FIG. 36, a thermal treatment may be applied to the intermediate semiconductor device illustrated in FIG. 35 to turn the layer of thermal-removable material 807 into a plurality of second air gaps 303 at the positions where the layer of thermal-removable material 807 previously occupied.

FIGS. 37 to 40 are schematic cross-sectional view diagrams illustrating part of a flow for fabricating a semiconductor device in accordance with one embodiment of the present disclosure.

Figure 37:
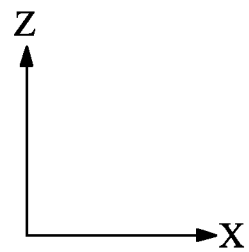
FIGS. 37 to 40 are schematic cross-sectional view diagrams illustrating part of a flow for fabricating a semiconductor device in accordance with one embodiment of the present disclosure.
Figure 37:
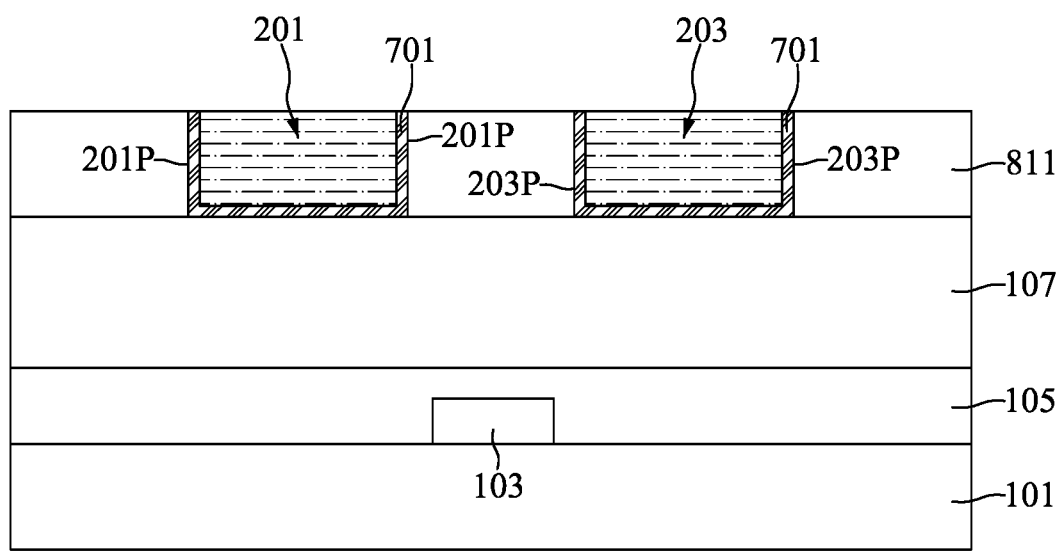

With reference to FIG. 37, an intermediate semiconductor device as illustrated in FIG. 3 may be provided. A sacrificial layer 811 may be formed on the second insulating layer 107. A photolithography process may be performed to define positions of the first conductive line 201 and the second conductive line 203 in the sacrificial layer 811. After the photolithography process, an etch process, such as an anisotropic dry etch process, may be performed to remove portions of the sacrificial layer 811 and concurrently form a plurality of trenches in the sacrificial layer 811. A plurality of barrier layers 701 may be formed in the plurality of trenches. A conductive material such as copper, aluminum, or titanium may be deposited into the plurality of trenches by a deposition process. After the deposition process, a planarization process, such as chemical mechanical polishing, may be performed to remove excess material, provide a substantially flat surface for subsequent processing steps, and conformally form the first conductive line 201 and the second conductive line 203.

The plurality of barrier layers 701 may be formed on the sides of the plurality of first protruding portions 201P, the sides of the plurality of second protruding portions 203P, the sides 201S-1, 201S-3 of the first conductive line 201 (Not shown in FIG. 37), the sides 203S-1, 203S-3 of the second conductive line 203 (Not shown in FIG. 37), the bottom surface of the first conductive line 201, and the bottom surface of the second conductive line 203. The bottom surface of the first conductive line 201 may include the bottom surfaces of the plurality of first protruding portions 201P. The bottom surface of the second conductive line 203 may include the bottom surfaces of the plurality of second protruding portions 203P. The plurality of barrier layers 701 may have a thickness between about 11 angstroms and about 13 angstroms.

The sacrificial layer 811 may be formed of, for example, polysilicon or other suitable material. The plurality of barrier layers 701 may be formed of, for example, titanium, titanium nitride, titanium silicon nitride, tantalum, tantalum nitride, tantalum silicon nitride, and combination thereof.

Figure 38:
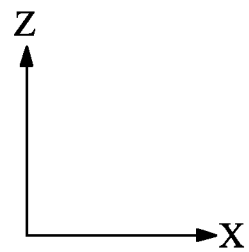
Figure 38:
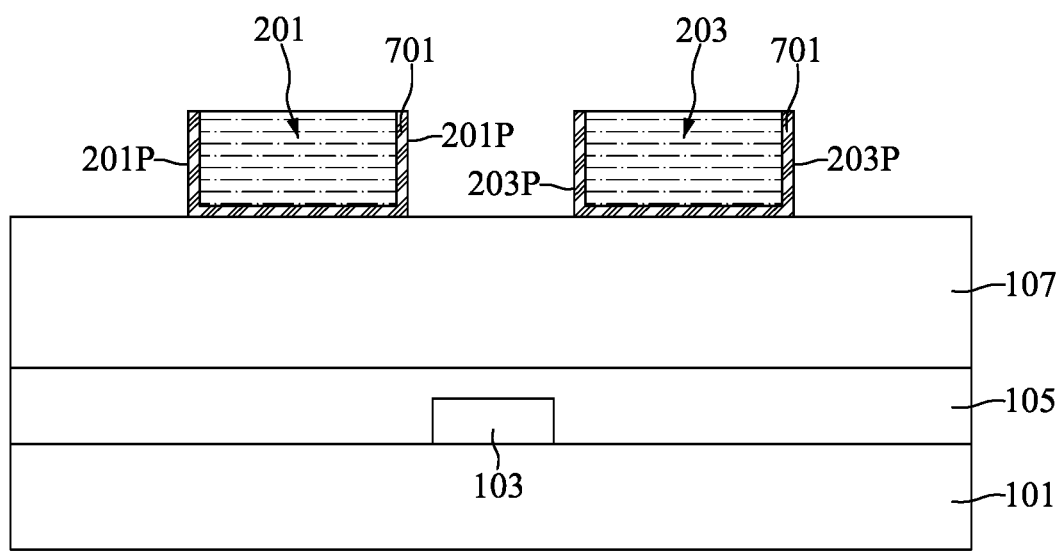

With reference to FIG. 38, the sacrificial layer 811 may be removed with a selective etch process. The selective etch process may have an etching selectivity to the sacrificial layer 811. The selectivity of an etching process may be generally expressed as a ratio of etching rates. For example, if one material is etched 25 times faster than other materials, the etch process may be described as having a selectivity of 25:1 or simply 25. In this regard, higher ratios or values indicate more selective etching processes. In the selective etch process, an etching rate for the sacrificial layer 811 may be greater than an etching rate of the first conductive line 201 or the second conductive line 203. The selectivity of the selective etch process may be greater than or equal to about 10, greater than or equal to about 12, greater than or equal to about 15, greater than or equal to about 20, or greater than or equal to about 25.

Figure 39:
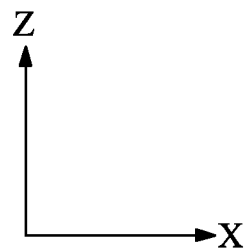
Figure 39:
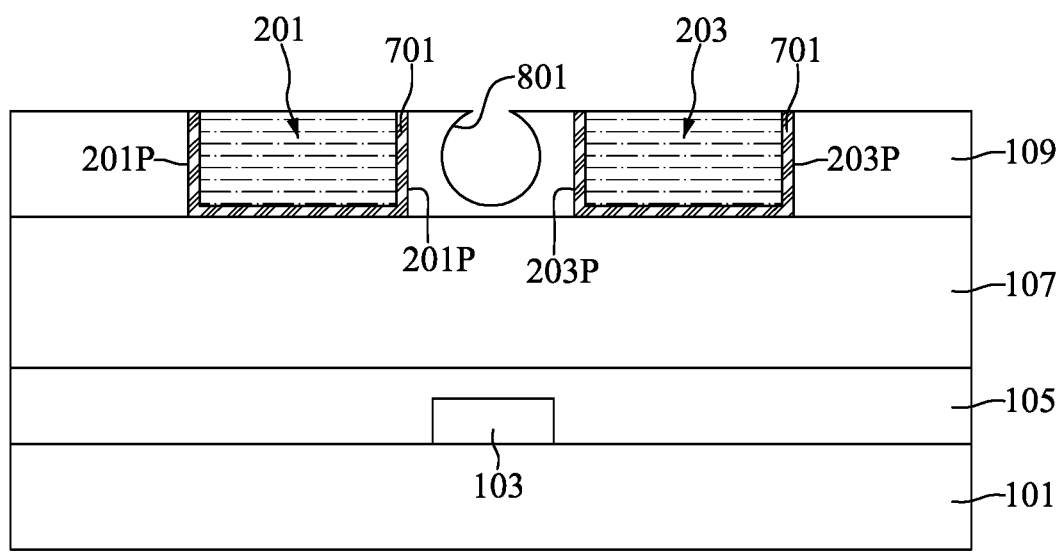
Figure 40:
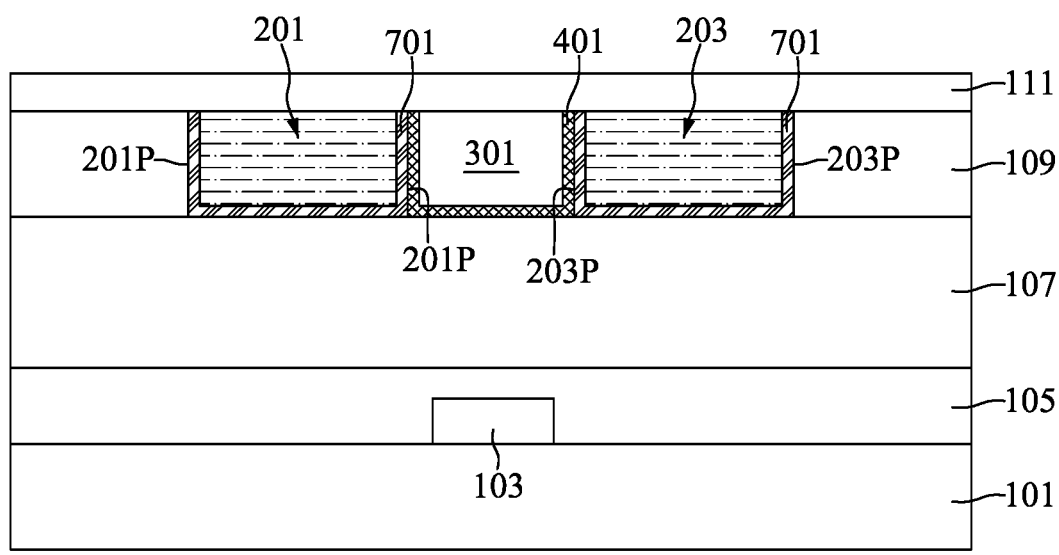

With reference to FIG. 39, a procedure similar to that illustrated in FIGS. 7 to 9 may be performed to form the plurality of voids 801. With reference to FIG. 40, a procedure similar to that illustrated in FIGS. 10 to 18 may be performed to form the first liner layer 401, the plurality of first air gaps 301, and the coverage layer 111.

Due to the design of the semiconductor device of the present disclosure, the parasitic capacitance of adjacent pairs of the conductive features (e.g. the first conductive line 201 and the second conductive line 203) may be alleviated by the plurality of first air gaps 301. In addition, no extra mask or patterning process is needed for formation of the plurality of first air gaps 301. Therefore, the cost of fabrication of the semiconductor device may be reduced.

One aspect of the present disclosure provides a semiconductor device including a substrate, a first conductive line positioned above the substrate and including two sides, a first protruding portion positioned on one of the two sides of the first conductive line, a second conductive line positioned adjacent to the first conductive line and including two sides, a second protruding portion positioned on one of the two sides of the second conductive line and face onto the first protruding portion, and an air gap positioned between the first protruding portion and the second protruding portion. A distance between the first protruding portion and the second protruding portion is less than a distance between the first conductive line and the second conductive line.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
   a substrate;
   a first conductive line positioned above the substrate and comprising two sides, wherein the first conductive line includes a first protruding portion positioned on one of the two sides of the first conductive line and a first recess portion position on the one of the two sides of the first conductive line, wherein a width of the first protruding portion is greater than a width of the first recess portion;
   a second conductive line coplanarly positioned adjacent to the first conductive line and comprising two sides, wherein the second conductive line includes a second protruding portion positioned on one of the two sides of the second conductive line and a second recess portion position on the one of the two sides of the second conductive line, wherein the second protruding portion faces onto the first protruding portion, and the second recess portion faces onto the first recess portion, wherein a width of the second protruding portion is greater than a width of the second recess portion; and
   an air gap positioned between the first protruding portion and the second protruding portion, and the air gap being absent between the first recess portion and the second recess portion;
   wherein a distance between the first protruding portion and the second protruding portion is less than a distance between the first recess portion and the second recess portion.

2. The semiconductor device of claim 1, further comprising a coverage layer positioned on the first conductive line and the second conductive line and sealed the air gap.

3. The semiconductor device of claim 2, wherein the first protruding portion is positioned adjacent to one end of the first conductive line and the second protruding portion is positioned adjacent to one end of the second conductive line.

4. The semiconductor device of claim 2, further comprising an insulating layer and a first liner layer positioned on one side of the first protruding portion, one side of the second protruding portion, and a top surface of the insulating layer, wherein the one side of the first protruding portion and the one side of the second protruding portion are faced to each other.

5. The semiconductor device of claim 2, further comprising an insulating layer and a plurality of second liner layers, wherein the first conductive line and the second conductive line are positioned on the insulating layer and the plurality of second liner layers are positioned on sides of the first protruding portion, sides of the second protruding portion, and a top surface of the insulating layer.

6. The semiconductor device of claim 2, further comprising a plurality of third liner layers positioned on sides of the first protruding portion and sides of the second protruding portion.

7. The semiconductor device of claim 4, further comprising a fourth liner layer positioned below the coverage layer and between the first protruding portion and the second protruding portion.

8. The semiconductor device of claim 3, further comprising a sealing layer positioned on the one end of the first conductive line and the one end of the second conductive line, wherein the first conductive line, the second conductive line, and the sealing layer are at a same vertical level.

9. The semiconductor device of claim 2, further comprising a plurality of protection layers positioned between the first conductive line and the coverage layer and between the second conductive line and the coverage layer.

10. The semiconductor device of claim 9, wherein the plurality of protection layers are formed of tantalum, tantalum nitride, tungsten carbonitride, cobalt-tungsten-phosphide alloy, cobalt phosphide alloy, nickel-tungsten-phosphide alloy, nickel boron alloy, cobalt-tungsten-boron alloy, nickel-rhenium-phosphide alloy, cobalt-rhenium-phosphide alloy, or nickel.

11. The semiconductor device of claim 1, wherein the air gap is extended in parallel to major axes of the first conductive line and the second conductive line.

12. The semiconductor device of claim 4, wherein the first liner layer is porous.

13. The semiconductor device of claim 12, wherein a porosity of the first liner layer is between about 45% and about 75%.

14. The semiconductor device of claim 1, further comprising a plurality of barrier layers positioned on sides of the first protruding portion and sides of the second protruding portion, wherein the plurality of barrier layers are formed of titanium, titanium nitride, titanium silicon nitride, tantalum, tantalum nitride, or tantalum silicon nitride.

15. The semiconductor device of claim 14, wherein a thickness of the plurality of barrier layers is between about 11 angstroms and about 13 angstroms.

* * * * *